United States Patent
Ahn et al.

(10) Patent No.: US 7,312,494 B2
(45) Date of Patent: Dec. 25, 2007

(54) LANTHANIDE OXIDE / HAFNIUM OXIDE DIELECTRIC LAYERS

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/931,343

(22) Filed: Aug. 31, 2004

(65) Prior Publication Data

US 2005/0029547 A1    Feb. 10, 2005

Related U.S. Application Data

(62) Division of application No. 10/602,323, filed on Jun. 24, 2003, now Pat. No. 7,192,824.

(51) Int. Cl.
H01L 27/108 (2006.01)
H01L 29/76 (2006.01)
H01L 29/94 (2006.01)
H01L 31/119 (2006.01)

(52) U.S. Cl. .................. 257/310; 257/411; 438/216; 438/763; 438/785

(58) Field of Classification Search ............ 257/310, 257/411; 438/216, 761, 763, 778, 785
See application file for complete search history.

(56) References Cited

U.S. PATENT DOCUMENTS

| | | | |
|---|---|---|---|
| 3,357,961 A | 12/1967 | Makowski et al. | |
| 4,058,430 A | 11/1977 | Suntola et al. | |
| 4,413,022 A | 11/1983 | Suntola et al. | |
| 4,993,358 A | 2/1991 | Mahawili | |
| 5,055,319 A | 10/1991 | Bunshah et al. | |
| 5,302,461 A | 4/1994 | Anthony | |
| 5,625,233 A | 4/1997 | Cabral, Jr. et al. | |
| 5,801,105 A | 9/1998 | Yano et al. | |
| 5,810,923 A | 9/1998 | Yano et al. | |
| 5,828,080 A | 10/1998 | Yano et al. | |
| 5,912,797 A | 6/1999 | Schneemeyer et al. | |
| 5,916,365 A | 6/1999 | Sherman | |

(Continued)

FOREIGN PATENT DOCUMENTS

EP   0540993 A1   5/1993

(Continued)

OTHER PUBLICATIONS

Aarik, Jaan, et al., "Influence of substrate temperature on atomic layer growth and properties of HfO$_2$ thin films", Thin Solid Films, 340(1-2), (1999), 110-116.

(Continued)

Primary Examiner—Fernando L. Toledo
(74) Attorney, Agent, or Firm—Schwegman, Lundberg & Woessner, P.A.

(57) ABSTRACT

Dielectric layers containing a hafnium oxide hafnium oxide layer arranged as one or more monolayers and a lanthanide oxide layer and a method of fabricating such a dielectric layer produce a reliable dielectric layer having an equivalent oxide thickness thinner than attainable using $SiO_2$. The dielectric can be formed as a nanolaminate of hafnium oxide and a lanthanide oxide.

28 Claims, 8 Drawing Sheets

U.S. PATENT DOCUMENTS

| | | |
|---|---|---|
| 6,013,553 A | 1/2000 | Wallace et al. |
| 6,020,024 A | 2/2000 | Maiti et al. |
| 6,020,243 A | 2/2000 | Wallace et al. |
| 6,025,627 A | 2/2000 | Forbes et al. |
| 6,120,531 A | 9/2000 | Zhou et al. |
| 6,187,484 B1 | 2/2001 | Glass et al. |
| 6,203,613 B1 | 3/2001 | Gates et al. |
| 6,207,589 B1 | 3/2001 | Ma et al. |
| 6,273,951 B1 | 8/2001 | Vaartstra |
| 6,274,937 B1 | 8/2001 | Ahn et al. |
| 6,281,042 B1 | 8/2001 | Ahn et al. |
| 6,291,866 B1 | 9/2001 | Wallace et al. |
| 6,294,813 B1 | 9/2001 | Forbes et al. |
| 6,297,103 B1 | 10/2001 | Ahn et al. |
| 6,297,539 B1 | 10/2001 | Ma et al. |
| 6,331,465 B1 | 12/2001 | Forbes et al. |
| 6,348,386 B1 | 2/2002 | Gilmer |
| 6,350,704 B1 | 2/2002 | Ahn et al. |
| 6,365,470 B1 | 4/2002 | Maeda |
| 6,387,712 B1 | 5/2002 | Yano et al. |
| 6,404,027 B1 | 6/2002 | Hong et al. |
| 6,420,230 B1 | 7/2002 | Derderian et al. |
| 6,420,279 B1 | 7/2002 | Ono et al. |
| 6,441,417 B1 | 8/2002 | Zhang et al. |
| 6,444,592 B1 | 9/2002 | Ballantine et al. |
| 6,448,192 B1 | 9/2002 | Kaushik |
| 6,451,641 B1 | 9/2002 | Halliyal et al. |
| 6,451,695 B2 | 9/2002 | Sneh |
| 6,458,701 B1 | 10/2002 | Chae et al. |
| 6,465,334 B1 | 10/2002 | Buynoski et al. |
| 6,482,740 B2 | 11/2002 | Soininen et al. |
| 6,495,436 B2 | 12/2002 | Ahn et al. |
| 6,509,280 B2 | 1/2003 | Choi |
| 6,514,820 B2 | 2/2003 | Ahn et al. |
| 6,514,828 B2 | 2/2003 | Ahn et al. |
| 6,518,610 B2 | 2/2003 | Yang et al. |
| 6,521,911 B2 | 2/2003 | Parsons et al. |
| 6,524,867 B2 | 2/2003 | Yang et al. |
| 6,527,866 B1 | 3/2003 | Matijasevic et al. |
| 6,531,354 B2 | 3/2003 | Maria et al. |
| 6,533,867 B2 | 3/2003 | Doppelhammer |
| 6,534,420 B2 | 3/2003 | Ahn et al. |
| 6,537,613 B1 | 3/2003 | Senzaki et al. |
| 6,541,079 B1 | 4/2003 | Bojarczuk, Jr. et al. |
| 6,541,353 B1 | 4/2003 | Sandhu et al. |
| 6,544,846 B2 | 4/2003 | Ahn et al. |
| 6,551,893 B1 | 4/2003 | Zheng et al. |
| 6,551,929 B1 | 4/2003 | Kori et al. |
| 6,552,383 B2 | 4/2003 | Ahn et al. |
| 6,559,472 B2 | 5/2003 | Sandhu et al. |
| 6,570,248 B1 | 5/2003 | Ahn et al. |
| 6,573,199 B2 | 6/2003 | Sandhu et al. |
| 6,586,349 B1 | 7/2003 | Jeon et al. |
| 6,586,792 B2 | 7/2003 | Ahn et al. |
| 6,590,252 B2 | 7/2003 | Kutsunai et al. |
| 6,592,942 B1 | 7/2003 | Van Wijck |
| 6,593,610 B2 | 7/2003 | Gonzalez |
| 6,596,636 B2 | 7/2003 | Sandhu et al. |
| 6,608,378 B2 | 8/2003 | Ahn et al. |
| 6,613,656 B2 | 9/2003 | Li |
| 6,613,702 B2 | 9/2003 | Sandhu et al. |
| 6,617,639 B1 | 9/2003 | Wang et al. |
| 6,620,670 B2 | 9/2003 | Song et al. |
| 6,627,260 B2 | 9/2003 | Derderian et al. |
| 6,627,503 B2 | 9/2003 | Ma et al. |
| 6,632,279 B1 | 10/2003 | Ritala et al. |
| 6,638,859 B2 | 10/2003 | Sneh et al. |
| 6,639,267 B2 | 10/2003 | Eldridge |
| 6,642,573 B1 | 11/2003 | Halliyal et al. |
| 6,645,882 B1 | 11/2003 | Halliyal et al. |
| 6,652,924 B2 | 11/2003 | Sherman |
| 6,653,209 B1 | 11/2003 | Yamagata |
| 6,660,660 B2 | 12/2003 | Haukka et al. |
| 6,661,058 B2 | 12/2003 | Ahn et al. |
| 6,673,701 B1 | 1/2004 | Marsh et al. |
| 6,674,138 B1 | 1/2004 | Halliyal et al. |
| 6,683,005 B2 | 1/2004 | Sandhu et al. |
| 6,683,011 B2 | 1/2004 | Smith et al. |
| 6,686,212 B1 | 2/2004 | Conley, Jr. et al. |
| 6,696,332 B2 | 2/2004 | Visokay et al. |
| 6,699,747 B2 | 3/2004 | Ruff et al. |
| 6,709,989 B2 | 3/2004 | Ramdani et al. |
| 6,710,538 B1 | 3/2004 | Ahn et al. |
| 6,713,846 B1 | 3/2004 | Senzaki |
| 6,720,221 B1 | 4/2004 | Ahn et al. |
| 6,730,575 B2 | 5/2004 | Eldridge |
| 6,750,066 B1 | 6/2004 | Cheung et al. |
| 6,767,795 B2 | 7/2004 | Ahn et al. |
| 6,768,175 B1 | 7/2004 | Morishita et al. |
| 6,770,536 B2 | 8/2004 | Wilk et al. |
| 6,770,923 B2 | 8/2004 | Nguyen et al. |
| 6,774,050 B2 | 8/2004 | Ahn et al. |
| 6,777,353 B2 | 8/2004 | Putkonen |
| 6,780,704 B1 | 8/2004 | Raaijmakers et al. |
| 6,787,413 B2 | 9/2004 | Ahn et al. |
| 6,790,791 B2 | 9/2004 | Ahn et al. |
| 6,794,709 B2 | 9/2004 | Ahn et al. |
| 6,800,567 B2 | 10/2004 | Cho |
| 6,803,311 B2 | 10/2004 | Choi |
| 6,803,326 B2 | 10/2004 | Ahn et al. |
| 6,812,100 B2 | 11/2004 | Ahn et al. |
| 6,821,862 B2 | 11/2004 | Cho |
| 6,831,315 B2 | 12/2004 | Raaijmakers et al. |
| 6,833,285 B1 | 12/2004 | Ahn et al. |
| 6,833,308 B2 | 12/2004 | Ahn et al. |
| 6,835,111 B2 | 12/2004 | Ahn et al. |
| 6,844,203 B2 | 1/2005 | Ahn et al. |
| 6,852,167 B2 | 2/2005 | Ahn |
| 6,852,645 B2 | 2/2005 | Colombo et al. |
| 6,858,865 B2 | 2/2005 | Ahn et al. |
| 6,884,719 B2 | 4/2005 | Chang et al. |
| 6,884,739 B2 | 4/2005 | Ahn et al. |
| 6,893,984 B2 * | 5/2005 | Ahn et al. ............... 438/785 |
| 6,900,122 B2 | 5/2005 | Ahn et al. |
| 6,914,800 B2 | 7/2005 | Ahn et al. |
| 6,921,702 B2 | 7/2005 | Ahn et al. |
| 6,930,059 B2 | 8/2005 | Conley, Jr. et al. |
| 6,930,346 B2 | 8/2005 | Ahn et al. |
| 6,953,730 B2 | 10/2005 | Ahn et al. |
| 6,958,302 B2 | 10/2005 | Ahn et al. |
| 6,960,538 B2 | 11/2005 | Ahn et al. |
| 6,979,855 B2 | 12/2005 | Ahn et al. |
| 6,989,573 B2 | 1/2006 | Ahn et al. |
| 7,012,311 B2 | 3/2006 | Ohmi et al. |
| 7,026,694 B2 | 4/2006 | Ahn et al. |
| 7,045,430 B2 | 5/2006 | Ahn et al. |
| 7,049,192 B2 | 5/2006 | Ahn et al. |
| 7,064,058 B2 | 6/2006 | Ahn et al. |
| 7,081,421 B2 | 7/2006 | Ahn et al. |
| 7,084,078 B2 | 8/2006 | Ahn et al. |
| 7,101,813 B2 | 9/2006 | Ahn et al. |
| 7,122,464 B2 | 10/2006 | Vaartstra |
| 7,129,553 B2 | 10/2006 | Ahn et al. |
| 7,135,369 B2 | 11/2006 | Ahn et al. |
| 7,135,421 B2 | 11/2006 | Ahn et al. |
| 7,160,577 B2 | 1/2007 | Ahn et al. |
| 7,169,673 B2 | 1/2007 | Ahn et al. |
| 7,235,854 B2 | 6/2007 | Ahn et al. |
| 2001/0002280 A1 | 5/2001 | Sneh |
| 2001/0009695 A1 | 7/2001 | Saanila et al. |
| 2001/0024387 A1 | 9/2001 | Raaijmakers et al. |
| 2001/0030352 A1 | 10/2001 | Ruf et al. |
| 2001/0042505 A1 | 11/2001 | Vaartstra |
| 2002/0001971 A1 | 1/2002 | Cho |

| | | | | | |
|---|---|---|---|---|---|
| 2002/0004276 A1 | 1/2002 | Ahn et al. | 2004/0004244 A1 | 1/2004 | Ahn et al. |
| 2002/0004277 A1 | 1/2002 | Ahn et al. | 2004/0004247 A1 | 1/2004 | Forbes et al. |
| 2002/0024080 A1 | 2/2002 | Derderian et al. | 2004/0004859 A1 | 1/2004 | Forbes et al. |
| 2002/0025628 A1 | 2/2002 | Derderian et al. | 2004/0007171 A1 | 1/2004 | Ritala et al. |
| 2002/0046705 A1 | 4/2002 | Sandhu et al. | 2004/0016944 A1 | 1/2004 | Ahn et al. |
| 2002/0053869 A1 | 5/2002 | Ahn et al. | 2004/0023461 A1 | 2/2004 | Ahn et al. |
| 2002/0086555 A1 | 7/2002 | Ahn et al. | 2004/0033661 A1 | 2/2004 | Yeo et al. |
| 2002/0089023 A1 | 7/2002 | Yu et al. | 2004/0033681 A1 | 2/2004 | Ahn et al. |
| 2002/0089063 A1 | 7/2002 | Ahn et al. | 2004/0033701 A1 | 2/2004 | Ahn et al. |
| 2002/0090806 A1 | 7/2002 | Ahn et al. | 2004/0038525 A1 | 2/2004 | Meng et al. |
| 2002/0094632 A1 | 7/2002 | Agarwal et al. | 2004/0038554 A1 | 2/2004 | Ahn |
| 2002/0100418 A1 | 8/2002 | Sandhu et al. | 2004/0043541 A1 | 3/2004 | Ahn |
| 2002/0102818 A1 | 8/2002 | Sandhu et al. | 2004/0043569 A1 | 3/2004 | Ahn |
| 2002/0110991 A1 | 8/2002 | Li | 2004/0043635 A1 | 3/2004 | Vaartstra |
| 2002/0111001 A1 | 8/2002 | Ahn | 2004/0099889 A1 | 5/2004 | Frank et al. |
| 2002/0122885 A1 | 9/2002 | Ahn | 2004/0110348 A1 | 6/2004 | Ahn et al. |
| 2002/0130338 A1 | 9/2002 | Ahn et al. | 2004/0110391 A1 | 6/2004 | Ahn et al. |
| 2002/0135048 A1 | 9/2002 | Ahn et al. | 2004/0144980 A1 | 7/2004 | Ahn et al. |
| 2002/0142536 A1 | 10/2002 | Zhang et al. | 2004/0161899 A1 | 8/2004 | Luo et al. |
| 2002/0146916 A1 | 10/2002 | Irino et al. | 2004/0164357 A1 | 8/2004 | Ahn et al. |
| 2002/0155688 A1 | 10/2002 | Ahn | 2004/0164365 A1 | 8/2004 | Ahn et al. |
| 2002/0155689 A1 | 10/2002 | Ahn | 2004/0168627 A1 | 9/2004 | Conley, Jr. et al. |
| 2002/0164420 A1 | 11/2002 | Derderian et al. | 2004/0169453 A1 | 9/2004 | Ahn et al. |
| 2002/0167057 A1 | 11/2002 | Ahn et al. | 2004/0171280 A1 | 9/2004 | Conley, Jr. et al. |
| 2002/0167089 A1 | 11/2002 | Ahn et al. | 2004/0175882 A1 | 9/2004 | Ahn et al. |
| 2002/0192974 A1 | 12/2002 | Ahn et al. | 2004/0178439 A1 | 9/2004 | Ahn et al. |
| 2002/0192975 A1 | 12/2002 | Ahn | 2004/0183108 A1 | 9/2004 | Ahn |
| 2002/0192979 A1 | 12/2002 | Ahn | 2004/0185654 A1 | 9/2004 | Ahn |
| 2002/0195056 A1 | 12/2002 | Sandhu et al. | 2004/0189175 A1 | 9/2004 | Ahn et al. |
| 2003/0003635 A1 | 1/2003 | Paranjpe et al. | 2004/0203254 A1 | 10/2004 | Conley, Jr. et al. |
| 2003/0003702 A1 | 1/2003 | Ahn | 2004/0214399 A1 | 10/2004 | Ahn et al. |
| 2003/0003722 A1 | 1/2003 | Vaartstra | 2004/0222476 A1 | 11/2004 | Ahn et al. |
| 2003/0003730 A1 | 1/2003 | Li | 2004/0235313 A1 | 11/2004 | Frank et al. |
| 2003/0008243 A1 | 1/2003 | Ahn et al. | 2004/0248398 A1 | 12/2004 | Ahn et al. |
| 2003/0017717 A1 | 1/2003 | Ahn | 2004/0262700 A1 | 12/2004 | Ahn et al. |
| 2003/0020169 A1 | 1/2003 | Ahn et al. | 2004/0266217 A1 | 12/2004 | Kim et al. |
| 2003/0020180 A1 | 1/2003 | Ahn et al. | 2005/0009370 A1 | 1/2005 | Ahn |
| 2003/0032270 A1 | 2/2003 | Snyder et al. | 2005/0020017 A1 | 1/2005 | Ahn et al. |
| 2003/0042526 A1 | 3/2003 | Weimer | 2005/0023574 A1 | 2/2005 | Forbes et al. |
| 2003/0045060 A1 | 3/2003 | Ahn | 2005/0023584 A1 | 2/2005 | Derderian et al. |
| 2003/0045078 A1 | 3/2003 | Ahn et al. | 2005/0023594 A1 | 2/2005 | Ahn et al. |
| 2003/0045082 A1 | 3/2003 | Eldridge et al. | 2005/0023595 A1 | 2/2005 | Forbes et al. |
| 2003/0048666 A1 | 3/2003 | Eldridge et al. | 2005/0023624 A1 | 2/2005 | Ahn et al. |
| 2003/0049942 A1 | 3/2003 | Haukka et al. | 2005/0023625 A1 | 2/2005 | Ahn et al. |
| 2003/0052356 A1 | 3/2003 | Yang et al. | 2005/0023626 A1 | 2/2005 | Ahn et al. |
| 2003/0052358 A1 | 3/2003 | Weimer | 2005/0023627 A1 | 2/2005 | Ahn et al. |
| 2003/0059535 A1 | 3/2003 | Luo et al. | 2005/0026374 A1 | 2/2005 | Ahn et al. |
| 2003/0102501 A1 | 6/2003 | Yang et al. | 2005/0026458 A1 | 2/2005 | Basceri et al. |
| 2003/0119246 A1 | 6/2003 | Ahn | 2005/0029604 A1 | 2/2005 | Ahn et al. |
| 2003/0119291 A1 | 6/2003 | Ahn et al. | 2005/0029605 A1 | 2/2005 | Ahn et al. |
| 2003/0119313 A1 | 6/2003 | Yang et al. | 2005/0030825 A1 | 2/2005 | Ahn |
| 2003/0124794 A1 | 7/2003 | Girardie | 2005/0032292 A1 | 2/2005 | Ahn et al. |
| 2003/0132491 A1 | 7/2003 | Ahn | 2005/0034662 A1 | 2/2005 | Ahn |
| 2003/0139039 A1 | 7/2003 | Ahn et al. | 2005/0037563 A1 | 2/2005 | Ahn |
| 2003/0157764 A1 | 8/2003 | Ahn et al. | 2005/0054165 A1 | 3/2005 | Ahn et al. |
| 2003/0170389 A1 | 9/2003 | Sandhu | 2005/0077519 A1 | 4/2005 | Ahn et al. |
| 2003/0170403 A1 | 9/2003 | Doan et al. | 2005/0087134 A1 | 4/2005 | Ahn |
| 2003/0175411 A1 | 9/2003 | Kodas et al. | 2005/0124174 A1 | 6/2005 | Ahn et al. |
| 2003/0181039 A1 | 9/2003 | Sandhu et al. | 2005/0145957 A1 | 7/2005 | Ahn et al. |
| 2003/0183156 A1 | 10/2003 | Dando et al. | 2005/0145959 A1 | 7/2005 | Forbes |
| 2003/0185980 A1 | 10/2003 | Endo | 2005/0158973 A1 | 7/2005 | Ahn et al. |
| 2003/0193061 A1 | 10/2003 | Osten | 2005/0164521 A1 | 7/2005 | Ahn et al. |
| 2003/0194862 A1 | 10/2003 | Mardian | 2005/0227442 A1 | 10/2005 | Ahn et al. |
| 2003/0203626 A1 | 10/2003 | Derderian et al. | 2005/0277256 A1 | 12/2005 | Ahn et al. |
| 2003/0207032 A1 | 11/2003 | Ahn et al. | 2005/0280067 A1 | 12/2005 | Ahn et al. |
| 2003/0207540 A1 | 11/2003 | Ahn et al. | 2006/0000412 A1 | 1/2006 | Ahn et al. |
| 2003/0207564 A1 | 11/2003 | Ahn et al. | 2006/0001151 A1 | 1/2006 | Ahn et al. |
| 2003/0207593 A1 | 11/2003 | Derderian et al. | 2006/0003517 A1 | 1/2006 | Ahn et al. |
| 2003/0222300 A1 | 12/2003 | Basceri et al. | 2006/0023513 A1 | 2/2006 | Forbes et al. |
| 2003/0227033 A1 | 12/2003 | Ahn et al. | 2006/0024975 A1 | 2/2006 | Ahn et al. |
| 2003/0228747 A1* | 12/2003 | Ahn et al. ............... 438/591 | 2006/0028867 A1 | 2/2006 | Forbes et al. |
| 2003/0232511 A1 | 12/2003 | Metzner et al. | 2006/0028869 A1 | 2/2006 | Forbes et al. |
| 2003/0235961 A1 | 12/2003 | Metzner et al. | 2006/0043492 A1 | 3/2006 | Ahn et al. |

| | | |
|---|---|---|
| 2006/0043504 A1 | 3/2006 | Ahn et al. |
| 2006/0046505 A1 | 3/2006 | Ahn et al. |
| 2006/0046522 A1 | 3/2006 | Ahn et al. |
| 2006/0125030 A1 | 6/2006 | Ahn et al. |
| 2006/0128168 A1 | 6/2006 | Ahn et al. |
| 2006/0148180 A1 | 7/2006 | Ahn et al. |
| 2006/0176645 A1 | 8/2006 | Ahn et al. |
| 2006/0177975 A1 | 8/2006 | Ahn et al. |
| 2006/0183272 A1 | 8/2006 | Ahn et al. |
| 2006/0189154 A1 | 8/2006 | Ahn et al. |
| 2006/0223337 A1 | 10/2006 | Ahn et al. |
| 2006/0228868 A1 | 10/2006 | Ahn et al. |
| 2006/0237764 A1 | 10/2006 | Ahn et al. |
| 2006/0244082 A1 | 11/2006 | Ahn et al. |
| 2006/0244100 A1 | 11/2006 | Ahn et al. |
| 2006/0246741 A1 | 11/2006 | Ahn et al. |
| 2006/0252211 A1 | 11/2006 | Ahn et al. |
| 2006/0255470 A1 | 11/2006 | Ahn et al. |
| 2006/0261397 A1 | 11/2006 | Ahn et al. |
| 2006/0263972 A1 | 11/2006 | Ahn et al. |
| 2006/0264064 A1 | 11/2006 | Ahn et al. |
| 2006/0270147 A1 | 11/2006 | Ahn et al. |
| 2006/0281330 A1 | 12/2006 | Ahn et al. |

FOREIGN PATENT DOCUMENTS

| | | |
|---|---|---|
| EP | 1096042 | 5/2001 |
| EP | 1124262 | 8/2001 |
| EP | 1324376 A1 | 7/2003 |
| JP | 62-199019 | 9/1987 |
| JP | 5090169 | 4/1993 |
| JP | 11-335849 | 12/1999 |
| JP | 2001-332546 | 11/2001 |
| WO | WO-01/97257 | 12/2001 |
| WO | WO-02/31875 | 4/2002 |
| WO | WO-0233729 A2 | 4/2002 |
| WO | WO-02/43115 | 5/2002 |

OTHER PUBLICATIONS

Aarik, Jaan, et al., "Phase transformations in hafnium dioxide thin films grown by atomic layer deposition at high temperatures", *Applied Surface Science*, 173(1-2), (Mar. 2001), 15-21.

Aarik, Jaan, et al., "Texture development in nanocrystalline hafnium dioxide thin films grown by atomic layer deposition", *Journal of Crystal Growth*, 220(1-2), (Nov. 15, 2000), 105-113.

Ahn, Kie Y., et al., "Ald of Amorphous Lanthanide Doped TIOX Films", U.S. Appl. No. 11/092,072, filed Mar. 29, 2005.

Ahn, Kie Y., et al., "Atomic Layer Deposited Hafnium Tantalum Oxide Dielectrics", U.S. Appl. No. 11/029,757, filed Jan. 5, 2005.

Ahn, Kie Y., et al., "Atomic Layer Deposited Lathanum Aluminum Oxide Dielectric Layer", U.S. Appl. No. 10/930,167, filed Aug. 31, 2004.

Ahn, Kie Y., et al., "Atomic Layer Deposited Lathanum Hafnium Oxide Dielectrics", U.S. Appl. No. 11/010,526, filed Dec. 13, 2004.

Ahn, Kie Y., et al., "Atomic Layer Deposited Titanium Aluminum Oxide Films", U.S. Appl. No. 10/931,533, filed Aug. 31, 2004.

Ahn, Kie Y., et al., "Atomic Layer Deposition of Hf3N4/Hf02 Films As Gate Dielectrics", U.S. Appl. No. 11/063,717, filed Feb. 23, 2005.

Ahn, Kie Y., et al., "Atomic Layer Deposition of Zirconium-Doped Tantalum Oxide Films", U.S. Appl. No. 10/909,959, filed Aug. 2, 2004.

Ahn, Kie Y., et al., "Atomic Layer Deposition of Zr3N4/ZrO2 Films As Gate Dielectrics", U.S. Appl. No. 11/058,563, filed Feb. 15, 2005.

Ahn, Kie Y., et al., "Hybrid ALD-CVD of PrXOY/ZrO2 Films as Gate Dielectrics", U.S. Appl. No. 11/010,766, filed Dec. 13, 2004.

Ahn, Kie Y., et al., "Ruthenium Gate for a Lanthanide Oxide Dielectric Layer", U.S. Appl. No. 10/926,812, filed Aug. 26, 2004.

Bendoraitis, J G., et al., "Optical energy gaps in the monoclinic oxides of hafnium and zirconium and their solid solutions", *Journal of Physical Chemistry*, 69(10), (1965), 3666-3667.

Bunshah, Rointan F., et al., "Deposition Technologies for Films and Coatings: Developments and Applications", Park Ridge, N.J., U.S.A. : *Noyes Publications*, (1982), 102-103.

Callegari, A., et al., "Physical and electrical characterization of Hafnium oxide and Hafnium silicate sputtered films", *Journal of Applied Physics*, 90(12), (Dec. 15, 2001), 6466-75.

Cheng, Baohong, et al., "The Impact of High-k Gate Dielectrics and Metal Gate Electrodes on Sub-100nm MOSFET's", *IEEE Transactions on Electron Devices*, 46(7), (Jul. 1999), 1537-1544.

Chin, A., et al., "High Quality La2O3 and Al2O3 Gate Dielectrics with Equivalent Oxide Thickness 5-10A", *Digest of Technical Papers. 2000 Symposium on VLSI Technology*, 2000, Honolulu,(Jun. 13-15, 2000), 16-17.

Clark, P , "IMEC Highlights Hafnium, Metal Gates for High-k Integration", *Semiconductor Business News*, at Silicon Strategies. com,(Oct. 11, 2002), 2 pages.

Clark-Phelps, R.B., et al., "Engineered Tantalum Aluminate and Hafnium Aluminate ALD Films for Ultrathin Dielectric Films with Improved Electric and Thermal Properties", *Gate Stack and Silicide Issues in Silicon Processing II. Symposium (Materials Research Society Symposium Proceedings* vol. 670), (Apr. 17, 2001), K2.2. 1-6.

Copel, M., et al., "Formation of a stratified lathanum silicate dielectric by reaction with Si(001)", *Applied Physics Letters*, 78(11), (Mar. 12, 2001), 1607-1609.

Forsgren, Katarina, "Atomic Layer Deposition of HfO2 using hafnium iodide", Conference held in Monterey, California, (May 2001), 1 page.

Forsgren, Katarina, "CVD and ALD of Group IV- and V-Oxides for Dielectric Applications", *Comprehensive Summaries of Uppsala Dissertation from the Faculty of Science and Technology*, 665, (2001).

Guha, S , et al., "Atomic beam deposition of lanthanum-and yttrium-based oxide thin films for gate dielectrics", *Applied Physics Letters*, 77, (2000), 2710-2712.

Gusev, E P., "Ultrathin High-K Dielectrics Grown by Atomic Layer Deposition: A Comparative Study of ZrO2, HfO2, Y2O3 and Al2O3", *Electrochemical Society Proceedings* vol. 2001-9, (2001), 189-195.

Gutowski, M J., "Thermodynamic stability of high-K dielectric metal oxides ZrO/sub 2/ and HfO/sub 2/ in contact with Si and SiO/sub 2/", *Applied Physics Letters*, 80(11), (Mar. 18, 2002), 1897-1899.

Hoshino, Y. , et al., "Characterization and Control of the HfO2/Si(001) Interfaces", *Applied Physics Letters*, 81, (Sep. 30, 2002), 2650-2652.

Huang, C. H., et al., "La/sub 2/O/sub 3//Si/sub 0.3/Ge/sub 0.7/p-MOSFETs with high hole mobility and good device characteristics", IEEE Electron Device Letters, 23(12), (Dec. 2002), 710-712.

Hubbard, K. J., "Thermodynamic stability of binary oxides in contact with silicon", *Journal of Materials Research*, 11(11), (Nov. 1996), 2757-2776.

Iwai, H. , et al., "Advanced gate dielectric materials for sub-100 nm CMOS", *International Electron Devices Meeting, 2002. IEDM '02. Digest*., (Dec. 8-11, 2002), 625-628.

Jeon, Sanghun , et al., "Excellent electrical characteristics of lanthanide (Pr, Nd, Sm, Gd, and Dy) oxide and lanthanide-doped oxide for MOS gate dielectric applications", *Electron Devices Meeting, 2001. IEDM Technical Digest. International*, (2001), 471-474.

Jung, H S., et al., "Improved current performance of CMOSFETs with nitrogen incorporated HfO/sub 2/-Al/sub 2/O/sub 3/ laminate gate dielectric", *Technical Digest of International Electron Devices Meeting 2002*, (2002), 853-856.

Kang, L , et al., "MOSFET devices with polysilicon on single-layer HfO/sub 2/ high-k dielectrics", *International Electron Devices Meeting 2000. Technical Digest. IEDM*, (2000), 35-8.

Kukli, Kaupo , et al., "Comparison of hafnium oxide films grown by atomic layer deposition from iodide and chloride precursors", *Thin Solid Films*, 416, (2002), 72-79.

Kukli, Kaupo, et al., "Influence of thickness and growth temperature on the properties of zirconium oxide films growth by atomic layer deposition on silicon", *Thin Solid Films*, 410(1-2), (2002), 53-60.

Kukli, K J., et al., "Properties of hafnium oxide films grown by atomic layer deposition from hafnium tetraiodide and oxygen", *Journal of Applied Physics*, 92(10), (Nov. 15, 2002), 5698-5703.

Kwo, J., et al., "High E gate dielectrics Gd2O3 and Y2O3 for silicon", Applied Physics Letters, 77(1), Jul. 3, 2000), 130-132.

Kwo, J., "Properties of high k gate dielectrics Gd2O3 and Y2O3 for Si", *Journal of Applied Physics*, 89(7), (2001), 3920-3927.

Lee, Byoung H., et al., "Characteristics of TaN gate MOSFET with ultrathin hafnium oxide (8 A-12 A)", *Electron Devices Meeting, 2000. IEDM Technical Digest. International*, (2000), 39-42.

Lee, A E., et al., "Epitaxially grown sputtered LaAlO3 films", *Applied Physics Letters*, 57(19), (Nov. 1990), 2019-2021.

Lee, S. J., et al., "Hafnium oxide gate stack prepared by in situ rapid thermal chemical vapor deposition process for advanced gate dielectrics", *Journal of Applied Physics*, 92 (5), (Sep. 1, 2002), 2807-09.

Lee, S J., et al., "High quality ultra thin CVD HfO2 gate stack with poly-Si gate electrode", *Electron Devices Meeting, 2000. IEDM Technical Digest. International*, (2000), 31-34.

Lee, Jung-Hyoung, et al., "Mass production worthy HfO/sub 2/-Al/sub 2/O/sub 3/ laminate capacitor technology using Hf liquid precursor for sub-100 nm DRAMs", *Electron Devices Meeting, 2002. IEDM '02. Digest. International*, (2002), 221-224.

Lee, Dong H., et al., "Metalorganic chemical vapor deposition of TiO2:N anatase thin film on Si substrate", *Appl. Phys. Lett.*, 66(7), (Feb. 1995), 815-816.

Lee, Byoung H., et al., "Ultrathin Hafnium Oxide with Low Leakage and excellent Reliability for Alternative Gate Dielectric Application", *IEEE Technical Digest of International Electron Devices Meeting 1999*, (1999), 133-136.

Leskela, M., et al., "ALD precursor chemistry: Evolution and future challenges", *J. Phys. IV France*, 9, (1999), 837-852.

Lucovsky, G, et al., "Microscopic model for enhanced dielectric constants in low concentration SiO/sub 2/-rich noncrystalline Zr and Hf silicate alloys", *Applied Physics Letters*, 77(18), (Oct. 2000), 2912-2914.

Maria, J. P., et al., "High temperature stability in lathanum and zirconia-based gate dielectrics", *Journal of Applied Physics*, 90(7), (Oct. 1, 2001), 3476-3482.

Michaelson, Herbert B., "The work function of the elements and its periodicity", *Journal of Applied Physics*, 48(11), (Nov. 1977), 4729-4733.

Molodyk, A A., et al., "Volatile Surfactant-Assisted MOCVD: Application to LaAl03 Thin Film Growth", *Chemical Vapor Deposition*, 6(3), (Jun. 2000), 133-138.

Muller, D. A., "The electronic structure at the atomic scale of ultrathin gate oxides", *Nature*, 399(6738), (Jun. 24, 1999), 758-61.

Neumayer, D A., et al., "Materials characterization of ZrO/sub 2/-SiO/sub 2/ and HfO/sub 2/-SiO/sub 2/ binary oxides deposited by chemical solution deposition", *Journal of Applied Physics*, 90(4), (Aug. 15, 2001), 1801-1808.

Nieminen, Minna, et al., "Formation and stability of lanthanum oxide thin films deposited from B-diketonate precursor", *Applied Surface Science*, 174(2), (Apr. 16, 2001), 155-165.

Ohmi, S., et al., "Rare Earth Metal Oxides for High-K Gate Insulator", *Electrochemical Society Proceedings*, vol. 2002-2, (2002), 376-387.

Osten, H J., et al., "High-k Gate Dielectrics with Ultra-low Leakage Current Based on Praseodymium Oxide", *Technical Digest of IEDM*, (2000), 653-656.

Park, Jaehoo, et al., "Chemical vapor deposition of HfO/sub 2/ thin films using a novel carbon-free precursor: characterization of the interface with the silicon substrate", *Journal of the Electrochemical Society*, 149(1), (2002), G89-G94.

Park, Byoung K., et al., "Interfacial reaction between chemically vapor-deposited HfO2 thin films and a HF-cleaned Si substrate during film growth and postannealing", *Applied Physics Letters*, 80(13), (Apr. 1, 2002), 2368-70.

Poveshchenko, V P., et al., "Investigation of the phase composition of films of zirconium, hafnium and yttrium oxides", *Soviet Journal of Optical Technology*, 51(5), (1984), 277-279.

Ritala, Mikko, "Atomic Layer Epitaxy Growth of Titanium, Zirconium and Hafnium Dioxide Thin Films", *Annales Academiae Scientiarum Fennicae*, (1994), 24-25.

Robertson, J., "Band offsets of wide-band-gap oxides and implications for future electronic devices", *Journal of Vacuum Science & Technology B (Microelectronics and Nanometer Structures)*, 18(3), (May-Jun. 2000), 1785-1791.

Smith, Ryan C., et al., "Chemical Vapour Deposition of the Oxides of Titanium, Zirconium and Hafnium for Use as High-k Materials in Microelectronic Devices. A Carbon-free Precursor for the Synthesis of Hafnium Dioxide", *Advanced Materials for Optics and Electronics*, 10(3-5), (2000), 105-14.

Sneh, Ofer, et al., "Thin film atomic layer deposition equipment for semiconductor processing", *Thin Solid Films*, 402(1-2), (Jan. 1, 2002), 248-261.

Suntola, T, "Atomic layer epitaxy", *Thin Solid Films*, 216(1), (Aug. 28, 1992), 84-89.

Suntola, T., "Atomic Layer Epitaxy", *Handbook of Crystal Growth, 3; Thin Films of Epitaxy, Part B: Growth Mechanics and Dynamics*, Amsterdam, (1994), 601-663.

Tavel, B, et al., "High performance 40 nm nMOSFETs with HfO/sub 2/ gate dielectric and polysilicon damascene gate", *Technical Digest of International Electron Devices Meetings 2002*, (2002), 429-432.

Van Dover, R. B., "Amorphous lanthanide-doped TiOx dielectric films", *Applied Physics Letters*, 74(20), (May 17, 1999), 3041-3043.

Wilk, G D., et al., "Hafnium and zirconium silicates for advanced gate dielectrics", *Journal of Applied Physics*, 87(1), (Jan. 2000), 484-492.

Wolf, Stanley, et al., "Future Trends in Sputter Deposition Processes", In: *Silicon Processing of the VLSI Era*, vol. 1, Lattice Press, (1986), 374-380.

Yamada, Hirotoshi, et al., "MOCVD of High-Dielectric-Constant Lanthanum Oxide Thin Films", *Journal of The Electrochemical Society*, 150(8), (Aug. 2003), G429-G435.

Yamamoto, K., et al., "Effect of Hf metal predeposition on the properties of sputtered HfO2/Hf stacked gate dielectrics", *Applied Physics Letters*, 81, (Sep. 9, 2002), 2053-2055.

Zhang, H., "Atomic Layer Deposition of High Dielectric Constant Nanolaminates", *Journal of The Electrochemical Society*, 148(4), (Apr. 2001), F63-F66.

Zhang, H, "High permittivity thin film nanolaminates", *Journal of Applied Physics*, 87(4), (Feb. 2000), 1921-1924.

Zhong, Huicai, et al., "Electrical Properties of Ru and RuO2 Gate Electrodes for Si-PMOSFET with ZrO2 and Zr-Silicate Dielectrics", *Journal of Electronic Materials*, 30(12), (Dec. 2001), 1493.

Zhu, W, et al., "HfO2 and HfAlO for CMOS: Thermal Stability and Current Transport", *IEEE International Electron Device Meeting 2001*, (2001), 463-466.

Ahn, Kie Y., "Cobalt Titanium Oxide Dielectric Films", U.S. Appl. No. 11/216,958, filed Aug. 31, 2005.

Ahn, Kie Y., "Gallium Lanthanide Oxide Films (working title)", U.S. Appl. No. 11/329,025, filed Jan. 10, 2006.

Ahn, Kie Y., et al., "Lanthanide Yttrium Aluminum Oxide Dielectric Films", U.S. Appl. No. 11/297,567, filed Dec. 8, 2005.

Ahn, Kie Y., "Lanthanum Aluminum Oxynitride Dielectric Films", U.S. Appl. No. 11/216,474, filed Aug. 31, 2005.

Ahn, Kie Y., et al., "Magnesium Titanium Oxide Films", U.S. Appl. No. 11/189,075, filed Jul. 25, 2005.

Ahn, Kie Y., "Zirconium-Doped Gadolinium Oxide Films", U.S. Appl. No. 11/215,578, filed Aug. 29, 2005.

\* cited by examiner

LANTHANIDE OXIDE / HAFNIUM OXIDE DIELECTRIC LAYERS

CROSS REFERENCE TO RELATED APPLICATIONS

This application is a Divisional under 37 C.F.R. 1.53(b) of U.S. application Ser. No. 10/602,323, filed 24 Jun. 2003 now U.S. Pat. No. 7,192,824, which application is incorporated herein by reference in its entirety.

This application is related to the following commonly assigned U.S. patent applications, which are herein incorporated by reference in their entirety:

U.S. patent application Ser. No. 10/602,315, entitled "Lanthanide Oxide/Hafnium Oxide Dielectrics," filed 24 Jun. 2003;

U.S. application Ser. No. 10/137,058, entitled: "Atomic Layer Deposition and Conversion," filed 2 May 2002;

U.S. application Ser. No. 10/137,168, entitled: "Methods, Systems, and Apparatus for Atomic-Layer Deposition of Aluminum Oxides in Integrated Circuits," filed 2 May 2002; and U.S. application Ser. No. 09/797,324, entitled: "Methods, Systems, and Apparatus for Uniform Chemical-Vapor Depositions," filed 1 Mar. 2001.

TECHNICAL FIELD

This application relates generally to semiconductor devices and device fabrication and, more particularly, to dielectric layers and their method of fabrication.

BACKGROUND

The semiconductor device industry has a market driven need to improve speed performance, improve its low static (off-state) power requirements, and adapt to a wide range of power supply and output voltage requirements for its silicon based microelectronic products. In particular, there is continuous pressure to reduce the size of devices such as transistors. The ultimate goal is to fabricate increasingly smaller and more reliable integrated circuits (ICs) for use in products such as processor chips, mobile telephones, and memory devices such as dynamic random access memories (DRAMs).

Currently, the semiconductor industry relies on the ability to reduce or scale the dimensions of its basic devices, primarily, the silicon based metal-oxide-semiconductor field effect transistor (MOSFET). A common configuration of such a transistor is shown in FIG. 1. While the following discussion uses FIG. 1 to illustrate a transistor from the prior art, one skilled in the art will recognize that the present invention could be incorporated into the transistor shown in FIG. 1 to form a transistor according to the present invention. A transistor 100 is fabricated in a substrate 110 that is typically silicon. Transistor 100 has a source region 120 and a drain region 130. A body region 132 is located between source region 120 and drain region 130, where body region 132 defines a channel of the transistor with a channel length 134. A gate dielectric 140 is located on body region 132 with a gate 150 located over gate dielectric 140. Gate dielectric 140 is typically an oxide, and is commonly referred to as a gate oxide. Gate 150 may be fabricated from polycrystalline silicon (polysilicon), or other conducting materials such as metal may be used.

In fabricating transistors to be smaller in size and reliably operate on lower power supplies, one design criteria is gate dielectric 140. The mainstay for forming the gate dielectric has been silicon dioxide, $SiO_2$. A thermally grown amorphous $SiO_2$ layer provides an electrically and thermodynamically stable material, where the interface of the $SiO_2$ layer with underlying Si provides a high quality interface as well as superior electrical isolation properties. However, increased scaling and other requirements in microelectronic devices have created the need to use other dielectric materials as gate dielectrics.

DETAILED DESCRIPTION

Figure 1:
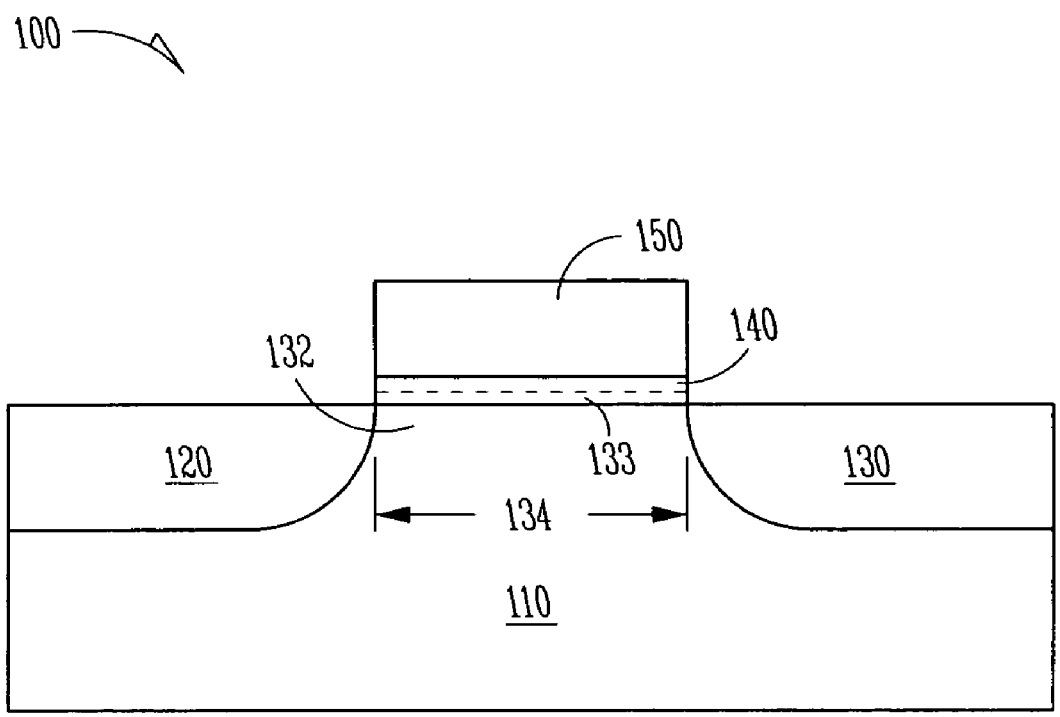
FIG. 1 shows a configuration of a transistor having a gate dielectric containing an atomic layer deposited hafnium oxide layer and an electronic beam evaporated lanthanide oxide layer, according to various embodiments of the present invention.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments disclosed herein are not necessarily mutually exclusive, as some disclosed embodiments can be combined with one or more other disclosed embodiments to form new embodiments.

The terms wafer and substrate used in the following description include any structure having an exposed surface with which to form an integrated circuit (IC). The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

An embodiment for a method for forming a dielectric layer containing a hafnium oxide and a lanthanide oxide includes forming a layer of the hafnium oxide by atomic layer deposition and forming a layer of the lanthanide oxide by electron beam evaporation. The layer of hafnium oxide is adjacent to and in contact with the layer of lanthanide oxide. In an embodiment, a dielectric layer includes a hafnium oxide/lanthanide oxide nanolaminate having an atomic layer deposited hafnium oxide layer and an electronic beam evaporated lanthanide oxide layer.

Dielectric layers containing an atomic layer deposited hafnium oxide layer and an electronic beam evaporated lanthanide oxide layer have a larger dielectric constant than silicon dioxide. Such dielectric layers provide a significantly thinner equivalent oxide thickness compared with a silicon oxide layer having the same physical thickness. Alternately, such dielectric layers provide a significantly thicker physical thickness than a silicon oxide layer having the same equivalent oxide thickness. Embodiments include structures for capacitors, transistors, memory devices, and electronic systems with dielectric layers containing atomic layer deposited hafnium oxide layer and an electronic beam evaporated lanthanide oxide layer, and methods for forming such structures.

In various embodiments, a dielectric layer includes a hafnium oxide layer and a lanthanide oxide layer, where the hafnium oxide layer is formed by atomic layer deposition (ALD) and the lanthanide oxide layer is formed by electron beam evaporation. The lanthanide oxide can be selected from $Pr_2O_3$, $Nd_2O_3$, $Sm_2O_3$, $Gd_2O_3$, and $Dy_2O_3$. In an embodiment, a dielectric layer includes a hafnium oxide/lanthanide oxide nanolaminate.

The term "nanolaminate" means a composite film of ultra thin layers of two or more materials in a layered stack, where the layers are alternating layers of materials of the composite film. Typically, each layer in a nanolaminate has a thickness of an order of magnitude in the nanometer range. Further, each individual material layer of the nanolaminate can have a thickness as low as a monolayer of the material. A nanolaminate of hafnium oxide and a lanthanide oxide includes at least one thin layer of hafnium oxide, and one thin layer of the lanthanide oxide, which can be written as a nanolaminate of hafnium oxide/lanthanide oxide. Further, a hafnium oxide/lanthanide oxide nanolaminate is not limited to alternating one lanthanide layer after a hafnium oxide layer, but can include multiple thin layers of a lanthanide oxide alternating with multiple thin layers of hafnium oxide. Further, the number of thin layers of lanthanide oxide and the number of thin layers of hafnium oxide can vary independently within a nanolaminate structure. Additionally, a hafnium oxide/lanthanide oxide nanolaminate can include layers of different lanthanide oxides, where each layer is independently selected from $Pr_2O_3$, $Nd_2O_3$, $Sm_2O_3$, $Gd_2O_3$, and $Dy_2O_3$. A dielectric layer containing alternating layers of a lanthanide oxide and a hafnium oxide has an effective dielectric constant related to the series combination of the layers of lanthanide oxide and hafnium oxide, which depends on the relative thicknesses of the lanthanide oxide layers and the hafnium oxide layers. Thus, a dielectric containing a hafnium oxide/lanthanide oxide nanolaminate can be engineered to effectively provide a selected dielectric constant.

A gate dielectric 140 of FIG. 1, when operating in a transistor, has both a physical gate dielectric thickness and an equivalent oxide thickness ($t_{eq}$). The equivalent oxide thickness quantifies the electrical properties, such as capacitance, of a gate dielectric 140 in terms of a representative physical thickness. The equivalent oxide thickness, $t_{eq}$, is defined as the thickness of a theoretical $SiO_2$ layer that would have the same capacitance density as a given dielectric, ignoring leakage current and reliability considerations.

A $SiO_2$ layer of thickness, t, deposited on a Si surface as a gate dielectric will have a $t_{eq}$ larger than its thickness, t. This $t_{eq}$ results from the capacitance in the surface channel on which the $SiO_2$ is deposited due to the formation of a depletion/inversion region. This depletion/inversion region may result in $t_{eq}$ being from 3 to 6 Angstroms (Å) larger than the $SiO_2$ thickness, t. Thus, with the semiconductor industry driving to scale the gate dielectric equivalent oxide thickness to under 10 Å, the physical thickness for a $SiO_2$ layer used for a gate dielectric would be need to be approximately 4 to 7 Å.

Additional characteristics for a $SiO_2$ layer depend on the gate electrode used in conjunction with the $SiO_2$ gate dielectric. Using a conventional polysilicon gate results in an additional increase in $t_{eq}$ for the $SiO_2$ layer. This additional thickness could be eliminated by using a metal gate electrode, though metal gates are not currently used in typical complementary metal-oxide-semiconductor field effect transistor (CMOS) technology. Thus, future devices would be designed towards a physical $SiO_2$ gate dielectric layer of about 5 Å or less. Such a small thickness for a $SiO_2$ oxide layer creates additional problems.

Silicon dioxide is used as a gate dielectric, in part, due to its electrical isolation properties in a $SiO_2$—Si based structure. This electrical isolation is due to the relatively large bandgap of $SiO_2$ (8.9 eV) making it a good insulator from electrical conduction. Signification reductions in its bandgap would eliminate it as a material for a gate dielectric. As the thickness of a $SiO_2$ layer decreases, the number of atomic layers, or monolayers of the $SiO_2$ decreases. At a certain thickness, the number of monolayers will be sufficiently small that the $SiO_2$ layer will not have a complete arrangement of atoms as in a larger or bulk layer. As a result of incomplete formation relative to a bulk structure, a thin $SiO_2$ layer of only one or two monolayers will not form a full bandgap. The lack of a full bandgap in a $SiO_2$ gate dielectric could cause an effective short between an underlying Si channel and an overlying polysilicon gate. This undesirable property sets a limit on the physical thickness to which a $SiO_2$ layer may be scaled. The minimum thickness due to this monolayer effect is thought to be about 7-8 Å. Therefore, for future devices to have a $t_{eq}$ less than about 10 Å, dielectrics other than $SiO_2$ need to be considered for use as a gate dielectric.

For a typical dielectric layer used as a gate dielectric, the capacitance is determined as one for a parallel plate capacitance: $C = \kappa \epsilon_0 A/t$, where $\kappa$ is the dielectric constant, $\epsilon_0$ is the permittivity of free space, A is the area of the capacitor, and t is the thickness of the dielectric. The thickness, t, of a material is related to its $t_{eq}$ for a given capacitance, with $SiO_2$ having a dielectric constant $\kappa_{ox}=3.9$, as $$t=(\kappa/\kappa_{ox})t_{eq}=(\kappa/3.9)t_{eq}.$$

Thus, materials with a dielectric constant greater than that of $SiO_2$, 3.9, will have a physical thickness that may be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, a reduced $t_{eq}$ for transistors may be realized by using dielectric materials with higher dielectric constants than $SiO_2$. The thinner $t_{eq}$ for lower transistor operating voltages and smaller transistor dimensions may be realized by a significant number of materials, but additional fabricating characteristics makes determining a suitable replacement for $SiO_2$ difficult.

The current view for the microelectronics industry is still for Si based devices. Thus, the gate dielectric employed will grow on a silicon substrate or silicon layer, which places significant restraints on the substitute dielectric material. During the formation of the dielectric on the silicon layer, there exists the possibility that a small layer of $SiO_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness of the dielectric being formed, written as $$t_{eq}=t_{SiO2}+(\kappa_{ox}/\kappa)t.$$

Thus, if a $SiO_2$ layer is formed in the process, the $t_{eq}$ is again limited by a $SiO_2$ layer. Thus, use of an ultra-thin silicon dioxide interface layer should be limited to significantly less than ten angstroms. In the event that a barrier layer is formed between the silicon layer and the desired dielectric in which the barrier layer prevents the formation of a $SiO_2$ layer, the $t_{eq}$ would be limited by the layer with the lowest dielectric constant. However, whether a single dielectric layer with a high dielectric constant or a barrier layer with a higher dielectric constant than $SiO_2$ is employed, the layer interfacing with the silicon layer must provide a high quality interface to maintain a high channel carrier mobility.

One of the advantages for using $SiO_2$ as a gate dielectric has been that the formation of the $SiO_2$ layer results in an amorphous gate dielectric. Having an amorphous structure for a gate dielectric is advantageous because grain boundaries in polycrystalline gate dielectrics provide high leakage paths. Additionally, grain size and orientation changes throughout a polycrystalline gate dielectric may cause variations in the layer's dielectric constant. Many materials having a high dielectric constant relative to $SiO_2$ also have a disadvantage of a crystalline form, at least in a bulk configuration. Thus, the best candidates for replacing $SiO_2$ as a gate dielectric are those with high dielectric constant, a relatively large bandgap, and are able to be fabricated as a thin layer with an amorphous form.

Materials such as $Ta_2O_3$, $TiO_2$, $Al_2O_3$, $HfO_2$, $HfSi_xO_y$, $HfSi_xO_y$, and barium strontium titanate (BST) have been proposed as replacements for $SiO_2$ as gate dielectric materials. Additional materials have been proposed to not only provide a material layer with a dielectric constant greater than silicon dioxide, but also to provide adjustment to the insulating properties of the material. Such materials can be provided as nanolaminates, for example, $Ta_2O_5/HfO_2$, $ZrO_2/HfO_2$, $Ta_2O_5/HfO_2$ nanolaminates. Providing dielectric layers configured as nanolaminates can provide a dielectric layer with relatively low leakage current properties.

In an embodiment of the present invention, a dielectric film having an atomic layer deposited hafnium oxide and an electron beam evaporated lanthanide oxide allows for the engineering of a dielectric layer with a dielectric constant significantly higher than that of silicon dioxide and a relatively low leakage current characteristic. Using layers of atomic layer deposited $HfO_2$ in various embodiments, provides layers, as compared to $ZrO_2$, that have a stronger tendency to form a single phase structure, a higher refractive index when deposited at low temperatures, a larger band gap, higher band offsets on silicon, and better thermal stability against silicide formation. Additionally, amorphous lanthanide oxides provide high oxide capacitance, low leakage current, and high thermal stability. Other considerations for selecting the material and method for forming a dielectric layer for use in electronic devices and systems concern the suitability of the material for applications requiring a dielectric layer to have an ultra-thin equivalent oxide thickness, form conformally on a substrate, and/or be engineered to specific thickness and elemental concentrations.

Another consideration concerns the roughness of the dielectric layer on a substrate. Surface roughness of the dielectric layer has a significant effect on the electrical properties of the gate oxide, and the resulting operating characteristics of the transistor. Leakage current through a physical 1.0 nanometer gate oxide has been found to be increased by a factor of 10 for every 0.1 increase in the root-mean-square (RMS) roughness.

During a conventional sputtering deposition process stage, particles of the material to be deposited bombard the surface at a high energy. When a particle hits the surface, some particles adhere, and other particles cause damage. High-energy impacts remove body region particles creating pits. The surface of such a deposited layer may have a rough contour due to the rough interface at the body region.

In an embodiment, a hafnium oxide layer having a substantially smooth surface relative to other processing techniques is formed on a substrate using atomic layer deposition. Further, the ALD deposited hafnium oxide layer provides a conformal coverage on the substrate surface on which it is deposited. A lanthanide oxide layer is then formed on the hafnium oxide layer, where the lanthanide oxide layer is formed by electron beam evaporation.

ALD, also known as atomic layer epitaxy (ALE), was developed in the early 1970's as a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. Between the pulses, the reaction chamber is purged with a gas, which in many cases is an inert gas, and/or evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired layer takes place. Subsequent to the layer growth reaction, reaction by-products and precursor excess are purged from the reaction chamber. With favourable precursor chemistry where the precursors adsorb and react with each other on the substrate aggressively, one ALD cycle may be performed in less than one second in properly designed flow type reaction chambers. Typically, precursor pulse times range from about 0.5 sec to about 2 to 3 seconds.

In ALD, the saturation of all the reaction and purging phases makes the growth self-limiting. This self-limiting growth results in large area uniformity and conformality, which has important applications for such cases as planar substrates, deep trenches, and in the processing of porous silicon and high surface area silica and alumina powders. Thus, ALD provides for controlling layer thickness in a straightforward manner by controlling the number of growth cycles.

ALD was originally developed to manufacture luminescent and dielectric layers needed in electroluminescent displays. Significant efforts have been made to apply ALD to the growth of doped zinc sulfide and alkaline earth metal sulfide layers. Additionally, ALD has been studied for the growth of different epitaxial II-V and II-VI layers, nonepitaxial crystalline or amorphous oxide and nitride layers and multilayer structures of these. There also has been considerable interest towards the ALD growth of silicon and germanium layers, but due to the difficult precursor chemistry, this has not been very successful.

The precursors used in an ALD process may be gaseous, liquid or solid. However, liquid or solid precursors must be volatile. The vapor pressure must be high enough for effective mass transportation. Also, solid and some liquid precursors need to be heated inside the reaction chamber and introduced through heated tubes to the substrates. The necessary vapor pressure must be reached at a temperature below the substrate temperature to avoid the condensation of the precursors on the substrate. Due to the self-limiting growth mechanisms of ALD, relatively low vapor pressure solid precursors may be used though evaporation rates may somewhat vary during the process because of changes in their surface area.

There are several other characteristics for precursors used in ALD. The precursors must be thermally stable at the substrate temperature because their decomposition would destroy the surface control and accordingly the advantages of the ALD method that relies on the reaction of the precursor at the substrate surface. A slight decomposition, if slow compared to the ALD growth, may be tolerated.

The precursors have to chemisorb on or react with the surface, though the interaction between the precursor and the surface as well as the mechanism for the adsorption is different for different precursors. The molecules at the substrate surface must react aggressively with the second precursor to form the desired solid layer. Additionally, precursors should not react with the layer to cause etching, and precursors should not dissolve in the layer. Using highly reactive precursors in ALD contrasts with the selection of precursors for conventional CVD.

The by-products in the reaction must be gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. The metal precursor reaction at the substrate is typically followed by an inert gas pulse to remove excess precursor and by-products from the reaction chamber prior to pulsing the next precursor of the fabrication sequence.

By RS-ALD, layers can be layered in equal metered sequences that are all identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle may be realized.

The characteristics of RS-ALD include continuity at an interface, conformality over a substrate, use of low temperature and mildly oxidizing processes, freedom from first wafer effects and chamber dependence, growth thickness dependent solely on the number of cycles performed, and ability to engineer multilayer laminate layers with resolution of one to two monolayers. RS-ALD allows for deposition control on the order on monolayers and the ability to deposit monolayers of amorphous layers.

Herein, a sequence refers to the ALD material formation based on an ALD reaction of a precursor or a precursor with its reactant precursor. For example, forming a metal layer from a precursor containing the metal forms an embodiment of a metal sequence. Additionally, forming a layer of metal oxide from a precursor containing the metal and from an oxygen containing precursor as its reactant precursor forms an embodiment of a metal/oxygen sequence, which may be referred to as the metal oxide sequence. A cycle of a metal sequence includes pulsing a precursor containing the metal and pulsing a purging gas for the precursor. Further, a cycle of a metal oxide sequence includes pulsing a precursor containing the metal, pulsing a purging gas for the precursor, pulsing a reactant precursor, and pulsing a purging gas for the reactant precursor. Additionally, a cycle for a compound metal oxide includes pulsing a precursor containing a first metal, pulsing a purging gas for this precursor, pulsing a reactant precursor for the first metal precursor, pulsing a purging gas for the reactant precursor, pulsing a precursor containing a second metal, pulsing a purging gas for this precursor, pulsing a reactant precursor for the second metal precursor, and pulsing a purging gas for this reactant precursor. The order of the metal precursors can depend on the tendency of the metals to allow diffusion of atoms through the metal to the underlying substrate. The order employed can limit the amount of unwanted atomic diffusion to the substrate surface.

In an embodiment, a hafnium oxide layer is formed on a substrate mounted in a reaction chamber by ALD using precursor gases individually pulsed into the reaction chamber. Alternately, solid or liquid precursors may be used in an appropriately designed reaction chamber.

Figure 2A:
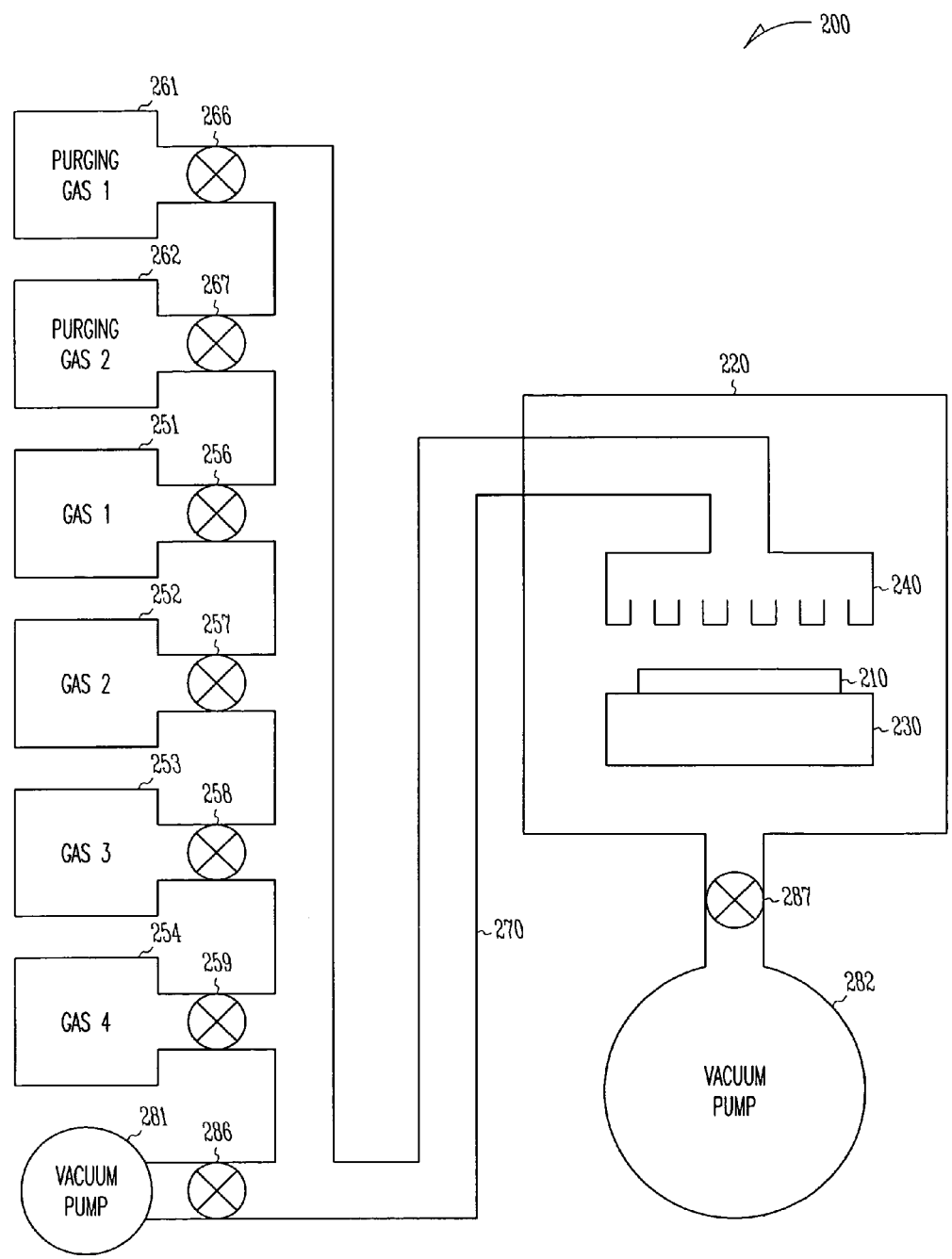
FIG. 2A depicts an atomic layer deposition system for processing a layer of hafnium oxide for a dielectric layer containing a hafnium oxide and a lanthanide oxide, according to various embodiments of the present invention.

FIG. 2A depicts an embodiment of an atomic layer deposition system 200 for processing a layer of hafnium oxide for a dielectric layer containing a hafnium oxide and a lanthanide oxide. The elements depicted are those elements necessary for discussion of embodiments of the present invention such that those skilled in the art may practice various embodiments of the present invention without undue experimentation. A further discussion of the ALD reaction chamber can be found in co-pending, commonly assigned U.S. patent application: entitled "Methods, Systems, and Apparatus for Uniform Chemical-Vapor Depositions," Ser. No. 09/797,324, filed 1 Mar. 2001, incorporated herein by reference.

In FIG. 2A, a substrate 210 is located inside a reaction chamber 220 of ALD system 200. Also located within reaction chamber 220 is a heating element 230, which is thermally coupled to substrate 210 to control the substrate temperature. A gas-distribution fixture 240 introduces precursor gases to the substrate 210. Each precursor gas originates from individual gas sources 251-254 whose flow is controlled by mass-flow controllers 256-259, respectively. Each gas source, 251-254, provides a precursor gas either by storing the precursor as a gas or by providing a location and apparatus for evaporating a solid or liquid material to form the selected precursor gas. Furthermore, additional gas sources may be included, one for each metal precursor employed and one for each reactant precursor associated with each metal precursor.

Also included in the ALD system are purging gas sources 261, 262, each of which is coupled to mass-flow controllers 266, 267, respectively. Furthermore, additional purging gas sources may be constructed in ALD system 200, one purging gas source for each precursor gas. For a process that uses the same purging gas for multiple precursor gases less purging gas sources are used in ALD system 200.

Gas sources 251-254 and purging gas sources 261-262 are coupled by their associated mass-flow controllers to a common gas line or conduit 270, which is coupled to the gas-distribution fixture 240 inside reaction chamber 220. Gas conduit 270 is also coupled to vacuum pump, or exhaust pump, 281 by mass-flow controller 286 to remove excess precursor gases, purging gases, and by-product gases at the end of a purging sequence from gas conduit 270.

Vacuum pump, or exhaust pump, 282 is coupled by mass-flow controller 287 to remove excess precursor gases, purging gases, and by-product gases at the end of a purging sequence from reaction chamber 220. For convenience, control displays, mounting apparatus, temperature sensing devices, substrate maneuvering apparatus, and necessary electrical connections as are known to those skilled in the art are not shown in FIG. 2A.

Figure 2B:
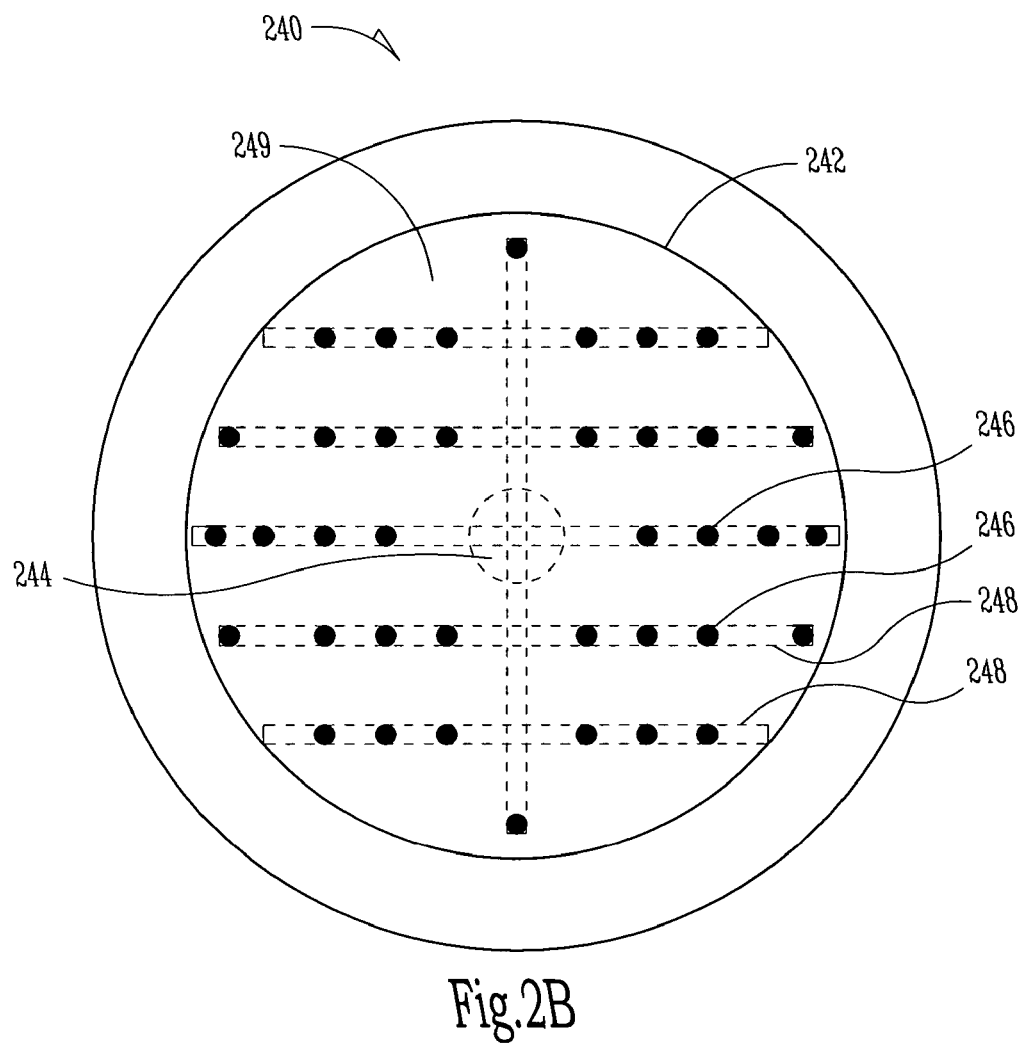
FIG. 2B depicts a gas-distribution fixture of an atomic layer deposition system for processing a layer of hafnium oxide for a dielectric layer containing a hafnium oxide and a lanthanide oxide, according to various embodiments of the present invention.

FIG. 2B depicts an embodiment of a gas-distribution fixture 240 of atomic layer deposition system 200 for processing a layer of hafnium oxide for a dielectric layer containing a hafnium oxide and a lanthanide oxide. Gas-distribution fixture 240 includes a gas-distribution member 242, and a gas inlet 244. Gas inlet 244 couples gas-distribution member 242 to gas conduit 270 of FIG. 2A. Gas-distribution member 242 includes gas-distribution holes, or orifices, 246 and gas-distribution channels 248. In the illustrated embodiment, holes 246 are substantially circular with a common diameter in the range of 15-20 microns, gas-distribution channels 248 have a common width in the range of 20-45 microns. The surface 249 of gas distribution member 242 having gas-distribution holes 246 is substantially planar and parallel to substrate 210 of FIG. 2A. However, other embodiments use other surface forms as well as shapes and sizes of holes and channels. The distribution and size of holes may also affect deposition thickness and thus might be used to assist thickness control. Holes 246 are coupled through gas-distribution channels 248 to gas inlet 244. Though ALD system 200 is well suited for practicing embodiments of the present invention, other ALD systems commercially available may be used.

Those of ordinary skill in the art of semiconductor fabrication understand the use, construction and fundamental operation of reaction chambers for deposition of material layers. Embodiments of the present invention may be practiced on a variety of such reaction chambers without undue experimentation. Furthermore, one of ordinary skill in the art will comprehend the necessary detection, measurement, and control techniques in the art of semiconductor fabrication upon reading and studying this disclosure.

The elements of ALD system 200 may be controlled by a computer. To focus on the use of ALD system 200 in the various embodiments of the present invention, the computer is not shown. Those skilled in the art can appreciate that the individual elements such as pressure control, temperature control, and gas flow within ALD system 200 may be under computer control. In an embodiment, a computer executes instructions stored in a computer readable medium to accurately control the integrated functioning of the elements of ALD system 200 to form a hafnium oxide layer for a dielectric layer containing a hafnium oxide layer and a lanthanide oxide layer. In an embodiment, following the ALD formation of a hafnium oxide layer, a layer of a lanthanide oxide is formed by electron beam evaporation.

Figure 3:
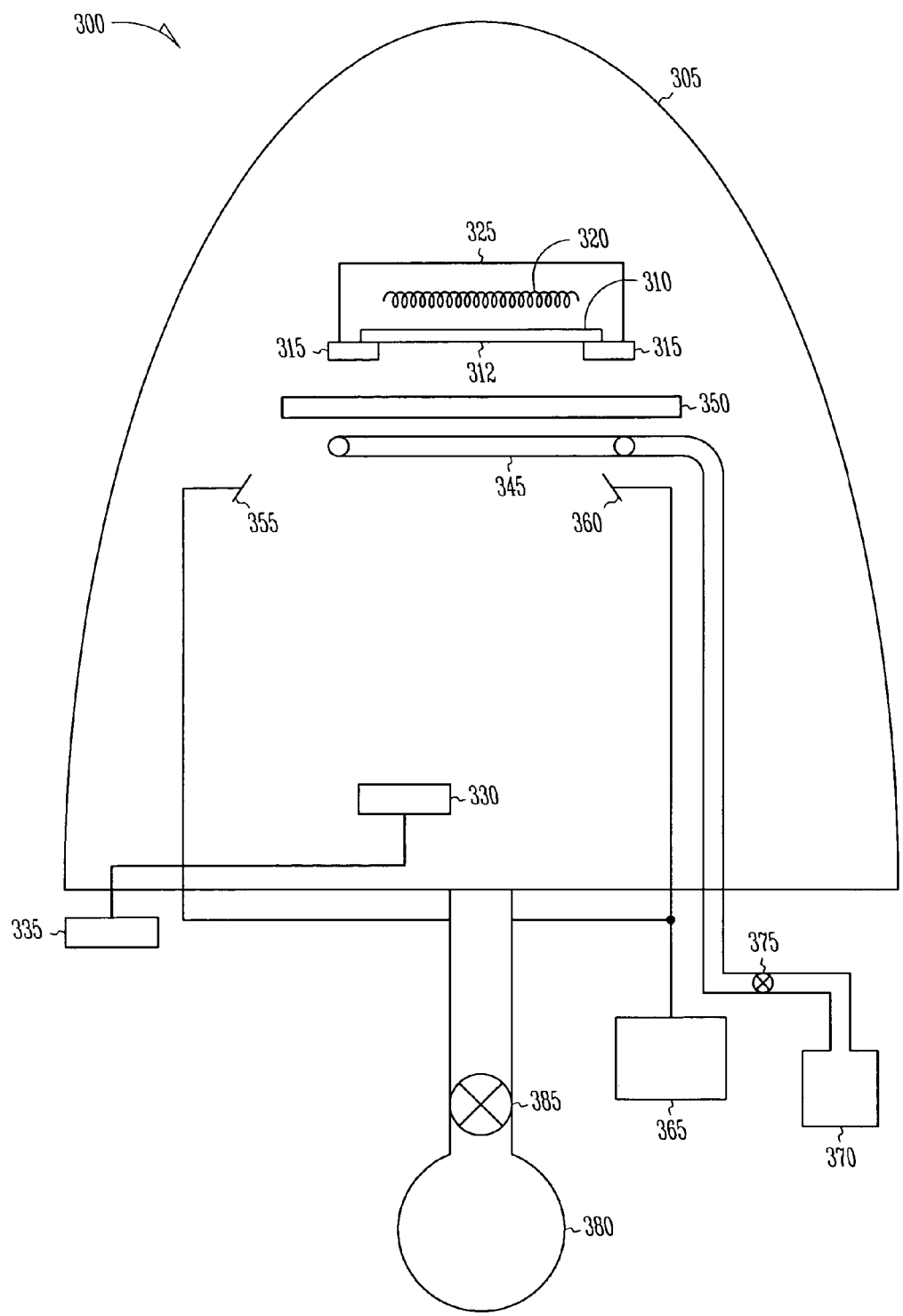
FIG. 3 depicts an electron beam evaporation system for processing a layer of lanthanide oxide for a dielectric layer containing a hafnium oxide and a lanthanide oxide, according to various embodiments of the present invention.

FIG. 3 depicts an electron beam evaporation system 300 for processing a layer of lanthanide oxide for a dielectric layer containing a hafnium oxide and a lanthanide oxide. Evaporation system 300 includes a reaction chamber 305 in which is located a substrate 310 having a surface 312 that is to be processed. Substrate 310 rests on substrate holder 315 and its temperature can be raised above room temperature using a heater 320 with its associated reflector 325. Evaporation system 300 also includes an electron gun device 330 regulated by electron gun controller 335 for depositing material on substrate surface 312.

Material evaporated using electron gun device 330 travels to substrate 310 through an ionizer ring 345 and shutter 350. Ionizer ring 345 provides supplemental oxygen for processes that require additional oxygen due to lost of oxygen in the evaporation of target materials. For target materials substantially void of oxygen, ionizer ring 345 provides initial oxygen to a film deposited on substrate surface 312 that is to undergo a subsequent oxidation process. Shutter 350 is used in conjunction with the control of electron gun device 330 to control the growth rate of a film on substrate 310. The growth rate is determined using quartz crystal monitors 355, 360. The quartz crystal monitors 355, 360 are coupled to a thickness/rate control 365, typically located outside reaction chamber 305.

Also located outside reaction chamber 305 is an oxygen gas source 370 including a mass-flow controller 375. In an embodiment, the oxygen gas source is ozone gas. Mass-flow controller 375 controls the flow of the oxygen source into reaction chamber 305. Further, a vacuum pump 380 with mass flow controller 385 maintains the overall atmosphere of evaporation system 300 at desired levels prior to, during, and after evaporation.

Electron gun device 330 can include an electron gun and receptacle for a target material that is to be evaporated. Target material placed in the target receptacle of electron gun device 330 is heated by impact from an electron beam from its associated electron gun. The electron beam is generated with an intensity and duration with which to evaporate the material in the target receptacle of electron gun device 330. The evaporated material then distributes throughout the reaction chamber 305. The evaporated material and pre-evaporation contaminants are prevented from depositing on substrate surface 312 in an unwanted manner by shutter 350. Further, electron gun device can be realized using commercially available devices as are known to those skilled in the art.

Ionizer ring 345 provides oxygen necessary to compensate for loss of oxygen in the evaporated target material, or to add initial oxygen for subsequent oxidation processing. In one embodiment, it includes a ring with a center axis. The ring has a plurality of openings adapted to direct oxygen flowing to ionizer ring 345 from oxygen gas source 370 towards substrate surface 312. Oxygen is uniformly distributed to substrate surface 312 by ionizer ring 345 positioned generally parallel to substrate 310.

The evaporation chamber 300 can be included as part of an overall processing system including ALD system 200 of FIGS. 2A, 2B. To avoid contamination of the surface of a layer formed by atomic layer deposition, evaporation chamber 300 can be connected to ALD system 200 using sealable connections to maintain the substrate, which is substrate 210 in FIG. 2 and substrate 310 of FIG. 3, in an appropriate environment between ALD processing of a hafnium oxide layer and electron beam evaporation of a lanthanide oxide layer. Other means as are known to those skilled in the art can be employed for maintaining an appropriate environment between different processing procedures.

Figure 4:
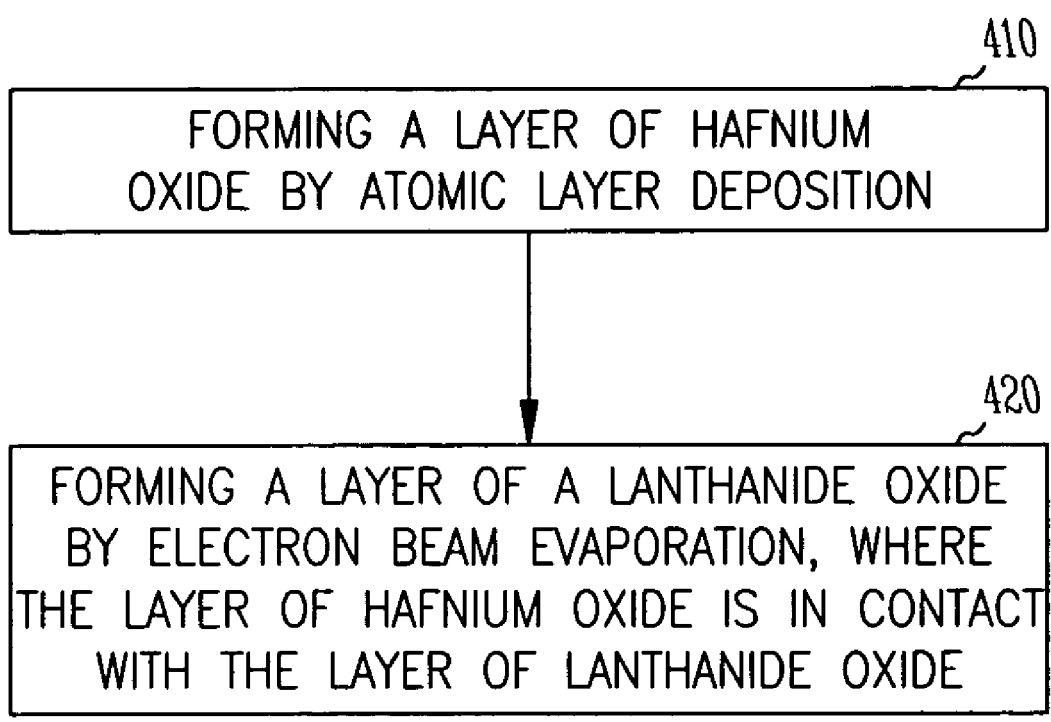
FIG. 4 illustrates a flow diagram of elements for an embodiment of a method to process a dielectric layer containing an atomic layer deposited hafnium oxide layer and an electronic beam evaporated lanthanide oxide layer, according to the present invention.

FIG. 4 illustrates a flow diagram of elements for an embodiment of a method to process a dielectric layer containing an atomic layer deposited hafnium oxide layer and an electronic beam evaporated lanthanide oxide layer. This embodiment includes forming a layer of hafnium oxide by atomic layer deposition, at block 410, and forming a layer of a lanthanide oxide by electron beam evaporation, at block 420, where the layer of hafnium oxide is adjacent to and in contact with the lanthanide oxide layer. The lanthanide oxide can be selected from $Pr_2O_3$, $Nd_2O_3$, $Sm_2O_3$, $Gd_2O_3$, and $Dy_2O_3$. In an embodiment the method includes forming the layer of hafnium oxide on a substrate and forming the layer of lanthanide oxide on the layer of hafnium oxide. Alternately, a layer of lanthanide oxide is formed on a substrate and a layer of hafnium oxide is formed on the layer of lanthanide oxide. In an embodiment, the method includes controlling the forming of the layer of hafnium oxide and the layer of the lanthanide oxide to form a lanthanide oxide/hafnium oxide nanolaminate. The nanolaminate may have multiple layers of different lanthanide oxides selected from $Pr_2O_3$, $Nd_2O_3$, $Sm_2O_3$, $Gd_2O_3$, and $Dy_2O_3$. For a dielectric layer having a hafnium oxide layer and one or more layers of a lanthanide oxide, the combined thickness of lanthanide oxide layers can be limited to a total thickness between about 2 nanometers and about 10 nanometers. Also, for a dielectric layer having a lanthanide oxide layer and one or more layers of hafnium oxide, the combined thickness of hafnium oxide layers can be limited to a total thickness between about 2 nanometers and about 10 nanometers. In an embodiment, hafnium oxide layers are limited to between 2 nanometers and 5 nanometers. In an embodiment, a dielectric layer includes a hafnium oxide layer and multiple layers of lanthanide oxide, where each layer of lanthanide oxide is limited to a thickness between about 2 nanometers and about 10 nanometers.

Performing each atomic layer deposition includes pulsing one or more precursors into a reaction chamber for a predetermined period. The predetermined period is individually controlled for each precursor pulsed into the reaction chamber. Further the substrate is maintained at a selected temperature for each pulsing of a precursor, where the selected temperature is set independently for pulsing each precursor. Additionally, each precursor may be pulsed into the reaction under separate environmental conditions. Appropriate temperatures and pressures are maintained dependent on the nature of the precursor, whether the precursor is a single precursor or a mixture of precursors.

Using atomic layer deposition, the pulsing of the precursor gases is separated by purging the reaction chamber with a purging gas following each pulsing of a precursor. In an embodiment, nitrogen gas is used as the purging gas following the pulsing of each precursor used in a cycle to form a hafnium oxide layer. Additionally, the reaction chamber may also be purged by evacuating the reaction chamber.

Figure 5:
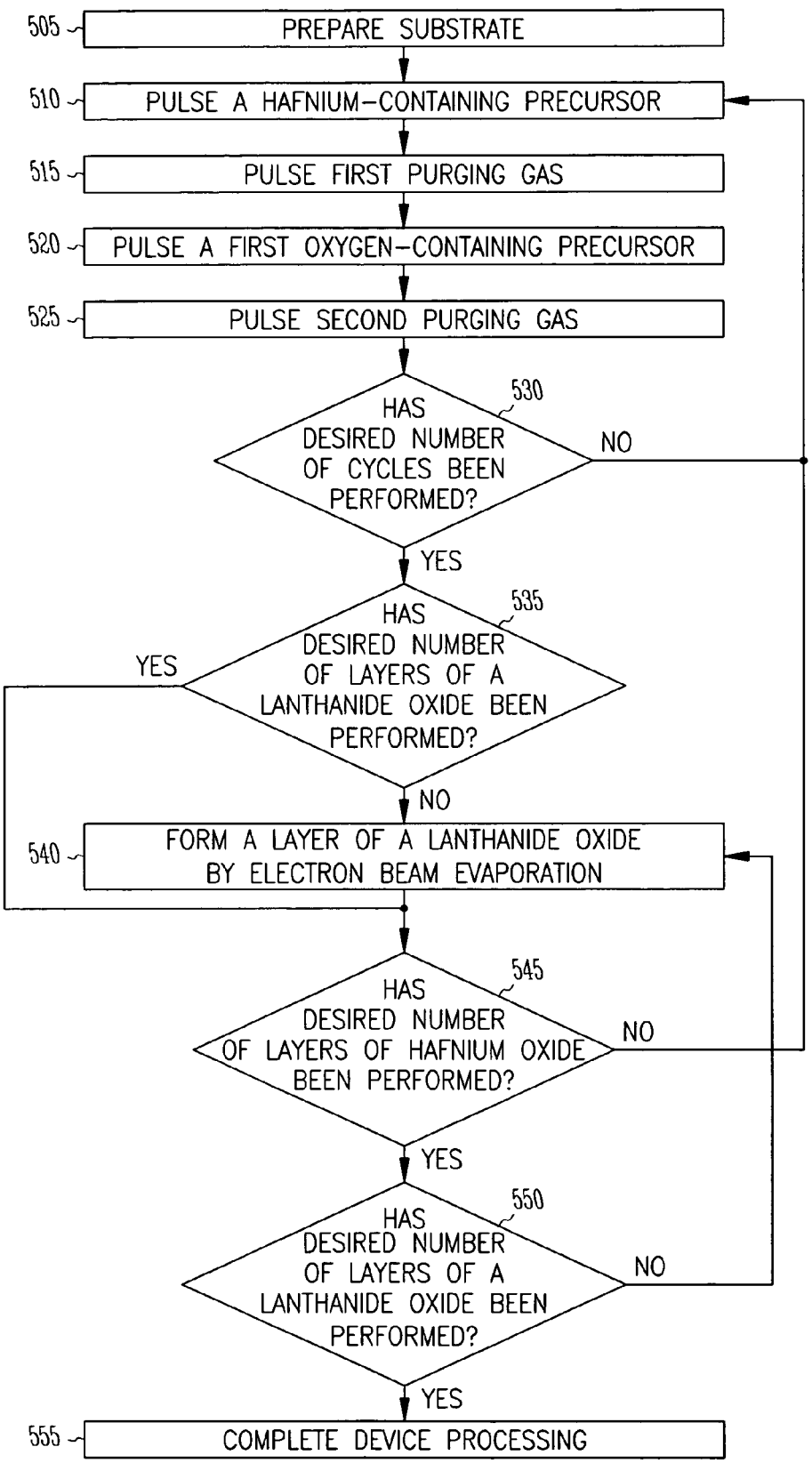
FIG. 5 illustrates a flow diagram of elements for an embodiment of a method to process a dielectric layer containing an atomic layer deposited hafnium oxide layer and an electronic beam evaporated lanthanide oxide layer, according to the present invention.

FIG. 5 illustrates a flow diagram of elements for an embodiment of a method to process a dielectric layer containing an atomic layer deposited hafnium oxide layer and an electronic beam evaporated lanthanide oxide layer. In an embodiment, the method depicted in FIG. 5 can be used to form a gate dielectric layer for a transistor. This embodiment may be implemented with the atomic layer deposition system 200 of FIGS. 2A, B, and the electron beam evaporation system of FIG. 3.

At block 505, substrate 210 is prepared. Substrate 210 used for forming a transistor is typically a silicon or silicon containing material. In other embodiments, germanium, gallium arsenide, silicon-on-sapphire substrates, or other suitable substrates may be used. This preparation process may include cleaning of substrate 210 and forming layers and regions of the substrate, such as drains and sources of a metal oxide semiconductor (MOS) transistor, prior to forming a gate dielectric. In an embodiment, the substrate is cleaned to provide an initial substrate depleted of its native oxide. In an embodiment, the initial substrate is cleaned to provide a hydrogen-terminated surface. In an embodiment, a silicon substrate undergoes a final hydrofluoric acid, HF, rinse prior to ALD processing to provide the silicon substrate with a hydrogen-terminated surface without a native silicon oxide layer.

In an embodiment, substrate 210 is prepared as a chemical oxide-terminated silicon surface prior to forming a hafnium oxide by atomic layer deposition. This preparation allows for forming an interface layer to provide a structure that may further aid in reducing the leakage current through the dielectric layer.

The sequencing of the formation of the regions of the transistor being processed follows typical sequencing that is generally performed in the fabrication of a MOS transistor as is well known to those skilled in the art. Included in the processing is the masking of substrate regions to be protected during the gate dielectric formation, as is typically performed in MOS fabrication. In this embodiment, the unmasked region may include a body region of a transistor; however one skilled in the art will recognize that other semiconductor device structures may utilize this process.

Additionally, substrate 210 in its ready for processing form is conveyed into a position in reaction chamber 220 for ALD processing.

At block 510, a hafnium-containing precursor is pulsed into reaction chamber 220. In an embodiment, $HfI_4$ is used as a precursor. In other embodiments, a hafnium-containing precursor includes but is not limited to $HfCl_4$, and $Hf(NO_3)_4$. The $HfI_4$ precursor is pulsed into reaction chamber 220 through the gas-distribution fixture 240 to substrate 210. Mass-flow controller 256 regulates the flow of the $HfI_4$ from gas source 251, where the $HfI_4$ gas is held at a temperature ranging from about 185° C. to about 195° C. In an embodiment, the substrate temperature is maintained between about 500° C. and about 750° C. In an embodiment, the substrate temperature is maintained at about 300° C. In other embodiments, the substrate may be held at lower temperatures lower than 300° C. The $HfI_4$ reacts with the surface of the substrate 210 in the desired region defined by the unmasked areas of the substrate 210.

At block 515, a first purging gas is pulsed into reaction chamber 220. In an embodiment, nitrogen with a purity of about 99.999% is used as a purging gas. Mass-flow controller 266 regulates the nitrogen flow from the purging gas source 261 into the gas conduit 270. Using the pure nitrogen purge avoids overlap of the precursor pulses and possible gas phase reactions.

A first oxygen-containing precursor is pulsed onto substrate 210, at block 520. In an embodiment, molecular oxygen is used as a precursor. In other embodiments, an oxygen-containing precursor for a hafnium/oxygen sequence includes but is not limited to $H_2O$, $H_2O_2$, an $H_2O$—$H_2O_2$ mixture, alcohol (ROH), $N_2O$, or $O_3$. The molecular oxygen precursor is pulsed into reaction chamber 220 through the gas-distribution fixture 240 on substrate 210. Mass-flow controller 257 regulates the flow of the water vapor from gas source 252. In an embodiment, the substrate temperature is maintained between about 100° C. and about 150° C. The water vapor reacts with at the surface of substrate 210 in the desired region defined by the unmasked areas of the substrate 210.

After pulsing the first oxygen-containing precursor, a second purging gas is pulsed, at block, 525. In an embodiment, nitrogen is used as the second purging gas. Excess precursor gas and reaction by-products are removed from the system by the purge gas in conjunction with the exhausting of reaction chamber 220 using vacuum pump 282 through mass-flow controller 287, and exhausting of the gas conduit 270 by the vacuum pump 281 through mass-flow controller 286. With the conclusion of the second purging gas pulse, a cycle for forming an atomic layer deposited hafnium oxide is completed.

In an embodiment using a $HfI_4/O_2$ sequence, the substrate may be held between about 500° C. and about 750° C. by the heating element 230. In an embodiment, the substrate may be held at 300° C. In other embodiments, the substrate may be held at lower temperatures lower than 300° C. The $HfI_4$ precursor can be pulsed for about 2.0 s. After the $HfI_4$ pulse, the hafnium/$O_2$ sequence continues with a purge pulse followed by a $O_2$ pulse followed by a purge pulse. In an embodiment, the $O_2$ pulse time is about 2.0 sec, and the two nitrogen purging pulse times are each at about 2.0 sec.

At block 530, a determination is made as to whether a desired number of cycles has been performed, that is, whether the number of completed cycles is equal to a predetermined number. The predetermined number corresponds to a predetermined thickness for the ALD hafnium oxide layer. The thickness of the hafnium oxide layer is determined by a fixed growth rate for the pulsing periods and precursors used, set at a value such as N nm/cycle. In an embodiment, a hafnium oxide layer may be grown at a rate ranging from about 0.07 nm/cycle to about 0.12 nm/cycle for an oxygen pressure ranging from about 0.1 Torr to about 0.3 Torr. For a desired dielectric layer thickness, t, the ALD process is repeated for t/N total cycles. Once the t/N cycles have completed, no further ALD processing for the current hafnium oxide layer is performed.

If the number of completed cycles is less than the predetermined number, the hafnium-containing precursor is pulsed into reaction chamber 220, at block 510, and the process continues. If the total number of cycles to form the desired thickness for the hafnium oxide layer has been completed, a determination is made as to whether the dielectric layer being formed contains the desired number of layers of a lanthanide oxide, at block 535. If the desired number of layers of a lanthanide oxide have been made, a determination is made as to whether the desired number of layers of hafnium oxide have been processed, at block 545. Such a case may occur in embodiments for a dielectric layer having hafnium oxide formed as consecutive layers on a lanthanide oxide layer. If more layers of hafnium oxide are required for the given application, the overall process continues as an atomic layer deposition with the pulsing of a hafnium-containing precursor, at block 510.

If it is determined, at block 535, that the desired number of layers of a lanthanide oxide have not been formed, then a layer of lanthanide oxide is formed on substrate 210, at block 540, which may include hafnium oxide layers and other lanthanide oxide layers. Substrate 210 in the ALD system, as illustrated in FIG. 2, is moved into the evaporation system depicted in FIG. 3, where the substrate 210, with its formed layers, becomes substrate 310 of FIG. 3. To avoid contamination of the surface of a layer formed by atomic layer deposition, evaporation chamber 300 can be connected to ALD system 200 using sealable connections to maintain the substrate in an appropriate environment between ALD processing of a hafnium oxide layer and electron beam evaporation of a lanthanide oxide layer. Other means as are known to those skilled in the art can be employed for maintaining an appropriate environment between different processing procedures.

Substrate 310, suitably masked for the given application and process procedures, is moved into evaporation chamber 305. Electron gun 330 contains a receptacle for a source target on which an electron beam is directed. Electron gun controller 335 regulates the rate of evaporation of material from the target source. Alternatively, evaporation chamber 305 can include multiple electron guns, where each electron gun is directed to different targets containing sources to form selected lanthanide oxides to be used at different times in the process.

In an embodiment, the target source of electron gun 330 contains a ceramic $Pr_6O_{11}$ source, which is evaporated due to the impact of the electron beam. The evaporated material is then distributed throughout the chamber 305. A dielectric layer of $Pr_2O_3$ is grown on surface 312 of substrate 310, which is maintained at a temperature ranging from about 100° C. to about 150° C. The growth rate can vary with a typical rate of 0.1 Å/s. In an embodiment in which a lanthanide is first formed on a substrate prior to forming a hafnium oxide layer, a $Pr_2O_3$ layer may include a thin amorphous interfacial layer separating a crystalline layer of $Pr_2O_3$ from the substrate on which it is grown. This thin amorphous layer may be beneficial in reducing the number of interface charges and eliminating any grain boundary paths for conductance from the substrate. Other source materials can be used for forming a $Pr_2O_3$ layer, as are known to those skilled in the art.

Alternately, the lanthanide oxide layer formed by electron beam evaporation for a dielectric layer containing an atomic layer deposited hafnium oxide and a lanthanide oxide can be an oxide selected from $Nd_2O_3$, $Sm_2O_3$, $Gd_2O_3$, or $Dy_2O_3$. Further, a dielectric layer may include a number of hafnium oxide layers and a number of lanthanide oxide layers, where the lanthanide oxide layers are different lanthanide oxides. The different lanthanide oxides can be selected from $Pr_2O_3$, $Nd_2O_3$, $Sm_2O_3$, $Gd_2O_3$, and $Dy_2O_3$. The source material for the particular lanthanide oxide is chosen from commercial materials for forming the lanthanide oxide by electron bean evaporation, as is known by those skilled in the art.

After forming the layer of lanthanide oxide, at block 540, a determination is made as to whether the desired number of hafnium oxide layers has been formed, at block 545. If the desired number of hafnium oxide layers has not been formed, substrate 310 is moved back into atomic layer deposition system 200 and a hafnium-containing precursor is pulsed, at block 510 and the process continues. If it is determined that the desired number of hafnium oxide layers have been formed, at block 545, it is then determined whether the desired number of layers of a lanthanide oxide have been formed, at block 550. If the desired number of lanthanide oxide layers has not been formed, a layer of lanthanide oxide is formed by electron beam evaporation, at block 540, and the process continues. If is determined that the desired number of lanthanide oxide layers have been formed, at block 550, and if the desired number of hafnium oxide layers have been formed, then the substrate is further processed to complete device processing, at block 555.

If the dielectric layer containing an atomic layer deposited hafnium oxide and an electron beam evaporated lanthanide oxide has been formed to have the desired thickness, the growth of the dielectric layer is complete. The dielectric layer may be annealed. To avoid the diffusion of oxygen during annealing to the semiconductor substrate surface, annealing may be performed in an oxygen-free environment for short periods of time. An embodiment of an annealing environment may include a nitrogen atmosphere. In addition to limiting or avoiding oxygen diffusion to the semiconductor substrate, the relatively low processing temperatures employed by atomic layer deposition of the hafnium oxide layers and by electron beam evaporation of the lanthanide layers allows for the formation of an amorphous dielectric layer.

At block 555, after forming the dielectric film containing atomic layer deposited hafnium oxide and electron beam deposited lanthanide oxide, processing the device having this dielectric layer is completed. In an embodiment, completing the device includes completing the formation of a transistor. In an embodiment, completing the device includes completing the formation of a capacitor. In an embodiment, completing the process includes completing the construction of a memory device having an array with access transistors formed with gate dielectrics containing atomic layer deposited hafnium oxide and electron beam deposited lanthanide oxide. In an embodiment, completing the process includes the formation of an electronic system including an information handling device that uses electronic devices with transistors formed with dielectric layers having an atomic layer deposited hafnium oxide and an electron beam deposited lanthanide oxide.

Upon reading and comprehending this disclosure, it can be appreciated by those skilled in the art that the elements of a method for forming a dielectric layer containing atomic layer deposited hafnium oxide and electron beam deposited lanthanide oxide in the embodiment of FIG. 5 may be performed under various environmental conditions, including various pressures and temperatures, and pulse periods depending on the dielectric layer to be formed for a given application and the systems used to fabricate such a dielectric layer. Determination of the environmental conditions, precursors used, purging gases employed, pulse periods for the precursors and purging gases, and electron beam target materials may be made without undue experimentation.

The elements for a method for forming a dielectric layer containing an atomic layer deposited hafnium oxide and an electron beam deposited lanthanide oxide as illustrated in FIG. 5 can vary and include numerous permutations. In an embodiment, an atomic layer deposited hafnium oxide layer is formed on a substrate and an electron beam evaporated lanthanide oxide layer is formed on the hafnium oxide layer. Alternately, an electron beam evaporated lanthanide oxide layer is formed on a substrate and an atomic layer deposited hafnium oxide layer is deposited on the lanthanide oxide layer. A hafnium oxide layer may be formed as multiple layers of atomic layer deposited hafnium oxide. Similarly, a lanthanide oxide layer may be formed as multiple layers of an electron beam evaporated lanthanide oxide. Additionally, a dielectric layer may contain multiple layers of lanthanide oxide, where two or more layers contain different lanthanide oxides selected from $Pr_2O_3$, $Nd_2O_3$, $Sm_2O_3$, $Gd_2O_3$, and $Dy_2O_3$.

In an embodiment, a dielectric containing hafnium oxide and lanthanide oxide is formed as a nanolaminate. The nanolaminate may have multiple layers of different lanthanide oxides selected from $Pr_2O_3$, $Nd_2O_3$, $Sm_2O_3$, $Gd_2O_3$, and $Dy_2O_3$. For a dielectric layer having a hafnium oxide layer and one or more layers of a lanthanide oxide, the combined thickness of lanthanide oxide layers can be limited to a total thickness between about 2 nanometers and about 10 nanometers. Also, for a dielectric layer having a lanthanide oxide layer and one or more layers of hafnium oxide, the combined thickness of hafnium oxide layers can be limited to a total thickness between about 2 nanometers and about 10 nanometers. In an embodiment, hafnium oxide layers are limited to between 2 nanometers and 5 nanometers. In an embodiment, a dielectric layer includes a hafnium oxide layer and multiple layers of lanthanide oxide, where each layer of lanthanide oxide is limited to a thickness between about 2 nanometers and about 10 nanometers. In an embodiment, a dielectric layer includes a lanthanide oxide layer and multiple layers of hafnium oxide, where each layer of hafnium oxide is limited to a thickness between about 2 nanometers and about 10 nanometers. In an embodiment, a dielectric layer containing an atomic layer deposited hafnium oxide layer and an electron beam evaporated lanthanide oxide layer has a thickness ranging from about 2 nanometers to about 20 nanometers.

A dielectric layer containing an atomic layer deposited hafnium oxide and an electron beam deposited lanthanide oxide may be processed in an atomic layer deposition system such as ALD system 200 and evaporation system 300 under computer control to perform various embodiments, and operated under computer-executable instructions to perform these embodiments. Instructions stored in a computer readable medium are executed by a computer to accurately control the integrated functioning of the elements of atomic layer deposition system 200 and evaporation system 300 to form a dielectric layer containing hafnium oxide and a lanthanide oxide, according to various embodiments. The computer-executable instructions may be provided in any computer-readable medium. Such computer-readable medium may include, but is not limited to, floppy disks, diskettes, hard disks, CD-ROMS, flash ROMS, nonvolatile ROM, and RAM.

Dielectric layers containing hafnium oxide layers and lanthanide oxide layers can have a wide range of dielectric constants determined by the series configuration and relative thickness of the hafiiium oxide layers and the lanthanide oxide layers. In bulk form, $HfO_2$ has a dielectric constant of about 25. Bulk $Pr_2O_3$ has a dielectric constant of about 31, while the dielectric constants for $Nd_2O_3$, $Sm_2O_3$, $Gd_2O_3$, and $Dy_2O_3$, in bulk form, are generally also in the range of 25-30. Consequently, a dielectric layer containing bulk layers of hafnium oxide and lanthanide oxide could be expected to have a dielectric constant engineered in the range from about 25 to about 31. Such a dielectric layer would have a $t_{eq}$ that is about one-sixth to one-eight smaller than a silicon oxide layer of the same thickness.

However, a thin dielectric layer with an interfacial layer formed between the surface of the substrate and the first layer of a hafnium oxide or a lanthanide oxide will have a $t_{eq}$ that is based on an interfacial layer physically in parallel with the dielectric layer equivalently forming a series configuration of electrical structures. Thus, the dielectric layer formed having an interfacial layer between it and the substrate on which it is grown can have an effective dielectric constant considerably less than a dielectric constant associated with the combination of hafnium oxide and lanthanide oxide layers.

Effective dielectric constants associated with thin layers of $Pr_2O_3$, $Nd_2O_3$, $Sm_2O_3$, $Gd_2O_3$, and $Dy_2O_3$ oxides on silicon have been reported to have dielectric constants in the range of 11 to 15 with interfacial regions having a thickness in the of about 0.5 nm to about 1.1 nm. See J. Sanghun et al., *Technical Digest of International Electron Devices Meetings* 2001, pp. 471-474 (2001). Similarly, $HfO_2$ also has been reported to have an effective dielectric constant reduced from its bulk value to a value in the range of 12 to 16 when formed as a thin layer on a silicon substrate with an interfacial layer. See K. Kukli et al., *Journal of Applied Physics*, vol. 92: no. 10, pp. 5698-5703 (2002). The effective dielectric constants for thin dielectric layers containing any of these materials and/or combinations of these materials may be reduced from their bulk value depending on the thickness and material composition of any interfacial layer that may be formed.

Further, for those cases in which a dielectric layer containing hafnium oxide and lanthanide oxide is formed with little or no interfacial layer, the dielectric layer may be subject to a thin film effect related to the abrupt termination of the film. A planar bulk or thick film can be considered as a bulk region with two surface regions. Due to the termination of the thick film, the properties of the two surface regions can vary from that of the bulk region. In a thick film, the effective properties of the film are dominated by the bulk region. In a thin film, including nanolaminates, the properties of the thin film are effectively controlled by two surface regions. See K. Natori et al., *Applied Physics Letters*, vol. 73: no. 5, pp. 632-634 (1998). Thus, thin films of hafnium oxide and lanthanide oxide may have effective dielectric constants reduced from their bulk values without being formed in a structure with interfacial regions. Without a size effect, dielectric layers containing hafnium oxide and lanthanide oxide may have a dielectric constant in the range of about 25 to about 31. With a size effect, dielectric layers containing hafnium oxide and lanthanide oxide may have dielectric constants in the range from about 11 to about 16.

The embodiments described herein provide a process for growing a dielectric layer containing an atomic layer deposited hafnium oxide and an electron beam evaporated lanthanide oxide having a wide range of useful equivalent oxide thickness, $t_{eq}$. The relatively large dielectric constant for such a dielectric layer ranges from about 11 to about 31, depending on the presence of an interfacial layer and/or on a size effect. Forming a dielectric layer according to various embodiments with a thickness ranging from 2 nanometers to 20 nanometers allows for the engineering of dielectric layers achieving a $t_{eq}$ in the range of about 0.7 nanometers to about 7 nanometers. Without an interfacial layer and without a size effect, the $t_{eq}$ for such a dielectric layer may range from about 0.25 nanometers to about 2.5 nanometers. A dielectric layer containing an atomic layer deposited hafnium oxide and an electron beam evaporated lanthanide oxide may be formed for applications with a $t_{eq}$ between 10 Å and 20 Å, or less than 10 Å.

Dielectric layers containing an atomic layer deposited hafnium oxide and an electron beam evaporated lanthanide oxide using embodiments of the present invention may be engineered with various structures and compositions including an amorphous structure. Embodiments using low processing temperatures tend to provide an amorphous structure, which is better suited for reducing leakage current than structures exhibiting a polycrystalline structure or a partial polycrystalline structure.

Figure 6:
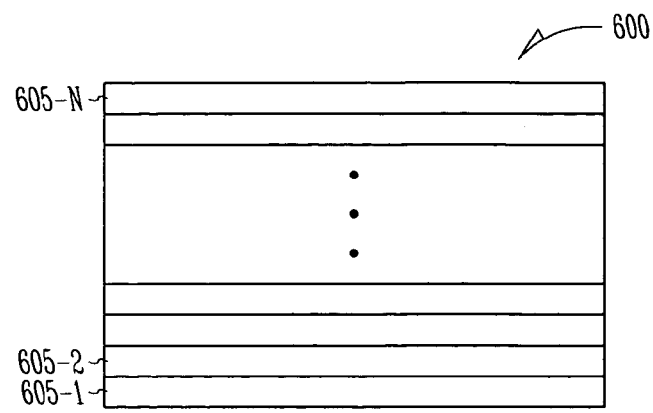
FIG. 6 depicts an embodiment of a dielectric layer including a nanolaminate of a hafnium oxide layer and a lanthanide oxide layer, according to the present invention.

FIG. 6 depicts a nanolaminate structure 600 for an embodiment of a dielectric structure including atomic layer deposited hafnium oxide and electron beam evaporated lanthanide oxide. Nanolaminate structure 600 includes a plurality of layers 605-1 to 605-N, where each layer contains atomic layer deposited hafnium oxide or electron beam evaporated lanthanide oxide. The sequencing of the layers depends on the application. The effective dielectric constant associated with nanolaminate structure 600 is that attributable to N capacitors in series, where each capacitor has a thickness defined by the thickness of the corresponding electron beam evaporated lanthanide oxide or atomic layer deposited hafnium oxide layer. By selecting each thickness and the composition of each layer, electron beam evaporated lanthanide oxide or atomic layer deposited hafnium oxide layer, a nanolaminate structure can be engineered to have a predetermined dielectric constant.

Embodiments for forming a dielectric layer including ALD processing of a hafnium oxide and processing of an lanthanide oxide by electron beam evaporation may be implemented to form transistors, capacitors, memory devices, and other electronic systems including electro-optic devices, microwave devices, and information handling devices. With careful preparation and engineering of the dielectric layer limiting the size of interfacial regions, a $t_{eq}$ less than about 10 Å for these devices is anticipated.

A transistor 100 as depicted in FIG. 1 may be constructed by forming a source region 120 and a drain region 130 in a silicon based substrate 110 where source and drain regions 120, 130 are separated by a body region 132. Body region 132 defines a channel having a channel length 134. A dielectric layer is disposed on substrate 110 formed as a layer containing an atomic layer deposited hafnium oxide and an electron beam evaporated lanthanide oxide. The resulting dielectric layer forms gate dielectric 140.

A gate 150 is formed over gate dielectric 140. Typically, forming gate 150 may include forming a polysilicon layer, though a metal gate may be formed in an alternative process.

An interfacial layer 133 may form between body region 132 and gate dielectric 140. Interfacial layer 133 may be limited to a thickness less than 1 nanometer, or to a thickness significantly less than 1 nanometer as to be effectively eliminated. Forming the substrate, the source and drain regions, and the gate is performed using standard processes known to those skilled in the art. Additionally, the sequencing of the various elements of the process for forming a transistor is conducted with standard fabrication processes, also as known to those skilled in the art.

Figure 7:
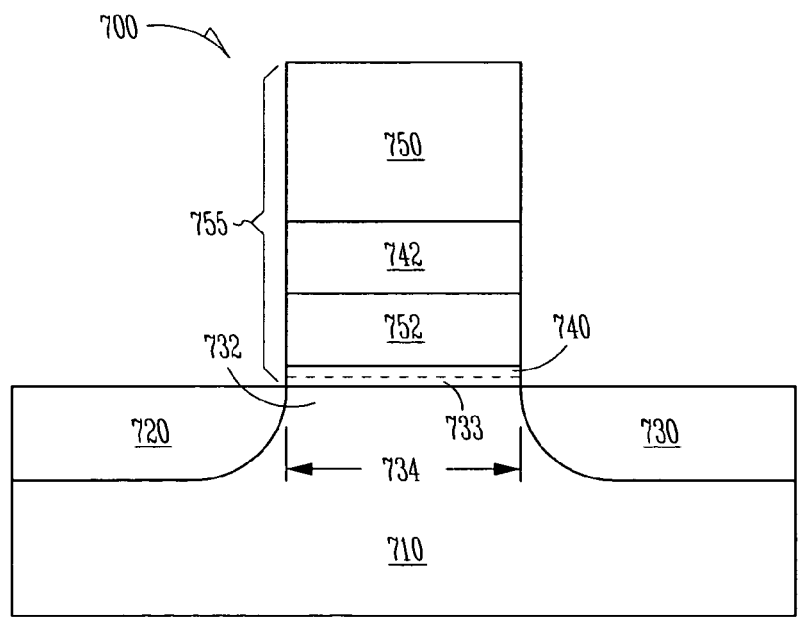
FIG. 7 shows an embodiment of a configuration of a transistor having a dielectric layer containing an atomic layer deposited hafnium oxide layer and an electronic beam evaporated lanthanide oxide layer, according to the present invention.

The method for forming a dielectric layer containing an atomic layer deposited hafnium oxide and an electron beam evaporated lanthanide oxide in various embodiments may be applied to other transistor structures having dielectric layers. FIG. 7 shows an embodiment of a configuration of a transistor 700 having a dielectric layer containing an atomic layer deposited hafnium oxide and an electron beam evaporated lanthanide oxide. Transistor 700 includes a silicon based substrate 710 with a source 720 and a drain 730 separated by a body region 732. Body region 732 between source 720 and drain 730 defines a channel region having a channel length 734. Located above body region 732 is a stack 755 including a gate dielectric 740, a floating gate 752, a floating gate dielectric 742, and a control gate 750. Gate dielectric 740 includes a dielectric containing an atomic layer deposited hafnium oxide layer and an electron beam evaporated lanthanide oxide layer as described herein with the remaining elements of the transistor 700 formed using processes known to those skilled in the art. Alternately, both gate dielectric 740 and floating gate dielectric 742 may be formed as dielectric layers containing an atomic layer deposited hafiiium oxide and an electron beam evaporated lanthanide oxide in various embodiments as described herein. An interfacial layer 733 may form between body region 732 and gate dielectric 740. Interfacial layer 733 may be limited to a thickness less than 1 nanometer, or to a thickness significantly less than 1 nanometer as to be effectively eliminated.

Figure 8:
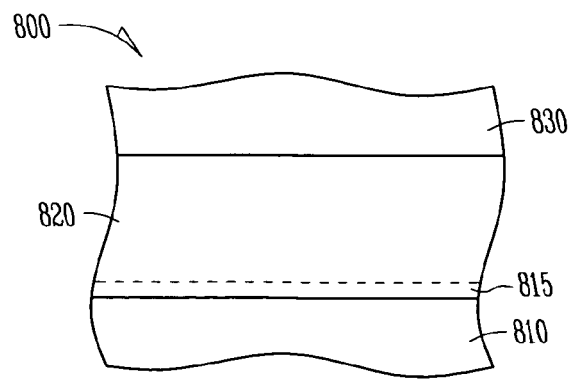
FIG. 8 shows an embodiment of a configuration of a capacitor having a dielectric layer containing an atomic layer deposited hafnium oxide layer and an electronic beam evaporated lanthanide oxide layer, according to the present invention.

The embodiments of methods for forming dielectric layers containing an atomic layer deposited hafnium oxide and an electron beam evaporated lanthanide oxide may also be applied to forming capacitors in various integrated circuits, memory devices, and electronic systems. In an embodiment for forming a capacitor 800 illustrated in FIG. 8, a method includes forming a first conductive layer 810, forming a dielectric layer 820 containing an atomic layer deposited hafnium oxide and an electron beam evaporated lanthanide oxide on first conductive layer 810, and forming a second conductive layer 830 on dielectric layer 820. An interfacial layer 815 may form between first conductive layer 810 and dielectric layer 820. Interfacial layer 815 may be limited to a thickness less than 1 nanometer, or to a thickness significantly less than 1 nanometer as to be effectively eliminated.

Transistors, capacitors, and other devices dielectric layers containing an atomic layer deposited hafnium oxide and an electron beam evaporated lanthanide oxide using methods described herein may be implemented into memory devices and electronic systems including information handling devices. Such information devices may include wireless systems, telecommunication systems, and computers. It will be recognized by one skilled in the art that several types of memory devices and electronic systems including information handling devices utilize embodiments of the present invention.

Figure 9:
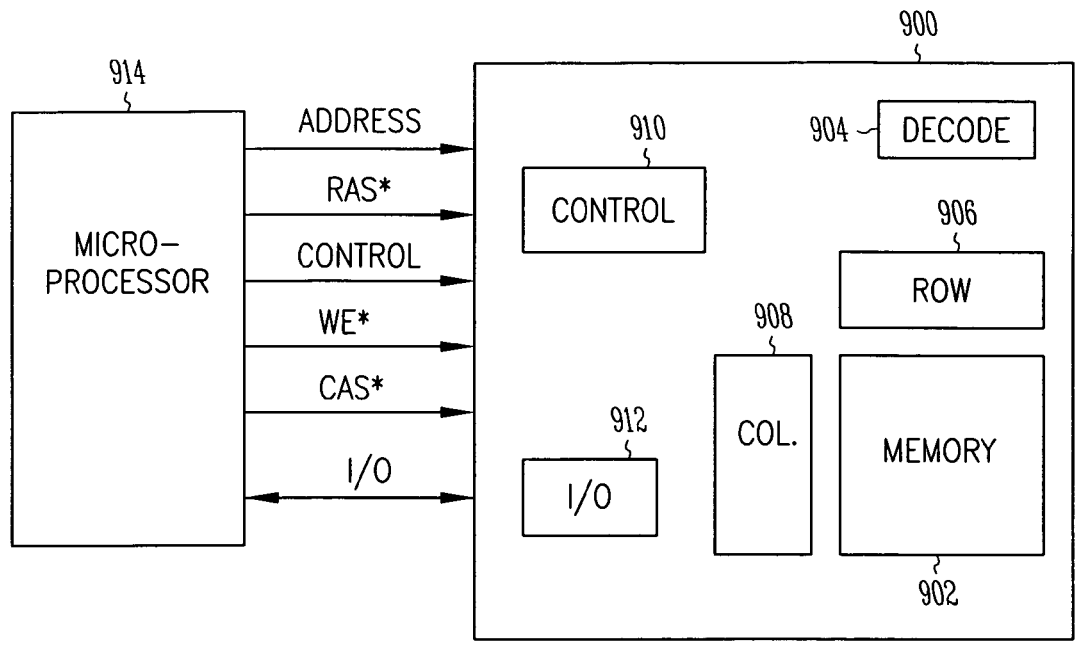
FIG. 9 is a simplified block diagram for an embodiment of a memory device with a dielectric layer containing an atomic layer deposited hafnium oxide layer and an electronic beam evaporated lanthanide oxide layer, according to the present invention.

FIG. 9 is a simplified block diagram of a memory device 900 using an embodiment of a dielectric containing an atomic layer deposited hafnium oxide and an electron beam evaporated lanthanide oxide. Memory device 900 includes an array of memory cells 902, address decoder 904, row access circuitry 906, column access circuitry 908, control circuitry 910, and Input/Output (I/O) circuit 912. The memory is operably coupled to an external microprocessor 914, or memory controller for memory accessing. Memory device 900 receives control signals from processor 914, such as WE*, RAS* and CAS* signals, which can be supplied on a system bus. Memory device 900 stores data that is accessed via I/O lines. Each memory cell in a row of memory cell array 902 is coupled to a common word line. The word line is coupled to gates of individual transistors, where at least one transistor has a gate coupled to a gate dielectric containing an atomic layer deposited hafnium oxide and an electron beam evaporated lanthanide oxide in accordance with the methods and structure previously described herein. Additionally, each memory cell in a column is coupled to a common bit line. Each cell in memory array 902 may include a storage capacitor and an access transistor as is conventional in the art. It will be appreciated by those skilled in the art that additional circuitry and control signals can be provided, and that the memory device of FIG. 9 has been simplified to focus on embodiments of the present invention.

It will be understood that the above description of a memory device is intended to provide a general understanding of the memory and is not a complete description of all the elements and features of a specific type of memory, such as DRAM (Dynamic Random Access Memory). Further, embodiments are equally applicable to any size and type of memory circuit and are not intended to be limited to the DRAM described above. Other alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

Figure 10:
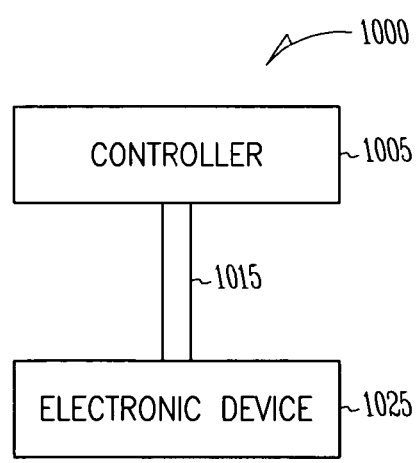
FIG. 10 illustrates a block diagram for an embodiment of an electronic system having devices with a dielectric layer containing an atomic layer deposited hafnium oxide layer and an electronic beam evaporated lanthanide oxide layer, according to the present invention.

FIG. 10 illustrates a block diagram for an electronic system 1000 having devices with an embodiment for a dielectric layer containing an atomic layer deposited hafnium oxide and an electron beam evaporated lanthanide oxide. Electronic system 1000 includes a controller 1005, a bus 1015, and an electronic device 1025, where bus 1015 provides electrical conductivity between controller 1005 and electronic device 1025. In various embodiments, controller 1005 and/or electronic device 1025 include an embodiment for a dielectric layer containing an atomic layer deposited hafnium oxide and an electron beam evaporated lanthanide oxide as previously discussed herein. In an embodiment, electronic system 1000 includes a plurality of electronic devices using an embodiment for a dielectric layer containing an atomic layer deposited hafnium oxide and an electron beam evaporated lanthanide oxide according to the present invention. Electronic system 1000 may include, but is not limited to, information handling devices, wireless systems, telecommunication systems, fiber optic systems, electro-optic systems, and computers.

CONCLUSION

A dielectric layer containing an atomic layer deposited hafnium oxide and an electron beam evaporated lanthanide oxide, using methods described herein, provides a reliable dielectric layer having an equivalent oxide thickness thinner than attainable using $SiO_2$. Forming dielectric layers containing an atomic layer deposited hafnium oxide and an electron beam evaporated lanthanide oxide in relatively low processing temperatures may allow for dielectric layers that are amorphous and conformally layered on a substrate surface. Further, the formation of these dielectric layers provides for enhanced dielectric and electrical properties relative to those attained with an amorphous $SiO_2$ layer. These properties of dielectric layers containing an atomic layer deposited hafnium oxide and an electron beam evaporated lanthanide oxide allow for application as dielectric layers in numerous devices and systems.

Capacitors, transistors, electro-optic devices, higher level ICs or devices, and electronic systems are constructed utilizing various embodiments for forming a dielectric layer containing an atomic layer deposited hafnium oxide and an electron beam evaporated lanthanide oxide structured to provide an ultra thin equivalent oxide thickness, $t_{eq}$. Dielectric layers containing an atomic layer deposited hafnium oxide and an electron beam evaporated lanthanide oxide are formed having a dielectric constant substantially higher than that of silicon dioxide, where such dielectric layers are capable of a $t_{eq}$ thinner than 10 Å, thinner than the expected limit for $SiO_2$ gate dielectrics. The thinner $t_{eq}$ of these dielectric layers allows for a higher capacitance than $SiO_2$ gate dielectrics, which provides further effective scaling for microelectronic devices and systems. At the same time, the physical thickness of the dielectric layer containing an atomic layer deposited hafnium oxide and an electron beam evaporated lanthanide oxide is much larger than the $SiO_2$ thickness associated with the $t_{eq}$ limit of $SiO_2$. Forming the larger thickness aids in the manufacturing process for gate dielectrics and other dielectric layers.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the present invention includes any other applications in which the above structures and fabrication methods are used. The scope of the present invention should be determined with reference to the appended claims, along with the full scope of equivalents to which such claims are entitled.

What is claimed is:

1. An electronic device comprising:
a substrate;
a dielectric layer disposed on the substrate, the dielectric layer including:
an atomic layer deposited hafnium oxide layer; and
an electron beam evaporated lanthanide oxide layer, wherein the atomic layer deposited hafnium oxide layer disposed on the electron beam evaporated lanthanide oxide layer, wherein the electron beam evaporated lanthanide oxide layer has a predetermined amount of oxygen in addition to oxygen of the lanthanide oxide.

2. The electronic device of claim 1, wherein the atomic layer deposited hafnium oxide layer and the electron beam evaporated lanthanide oxide layer are layers in a lanthanide oxide/hafnium oxide nanolaminate.

3. The electronic device of claim 1, further including electron beam evaporated lanthanide oxide layers, wherein the combined thickness of the electron beam evaporated lanthanide oxide layers is between about 2 nanometers and about 10 nanometers.

4. The electronic device of claim 1, further including atomic layer deposited hafnium oxide layers, wherein the combined thickness of the atomic layer deposited hafnium oxide layers is between about 2 nanometers and about 10 nanometers.

5. The electronic device of claim 1, wherein the atomic layer deposited hafnium oxide layer and the electron beam evaporated lanthanide oxide layer are layers in a lanthanide oxide/hafnium oxide nanolaminate having multiple layers of electron beam evaporated lanthanide oxide, each layer of electron beam evaporated lanthanide oxide limited to a thickness of between about 2 nanometers and about 10 nanometers.

6. The electronic device of claim 1, wherein the electron beam evaporated lanthanide oxide layer includes an oxide selected from $Pr_2O_3$, $Nd_2O_3$, $Sm_2O_3$, $Gd_2O_3$, and $Dy_2O_3$.

7. The electronic device of claim 1, wherein the dielectric layer is configured as a dielectric in a capacitor.

8. The electronic device of claim 1, wherein the dielectric layer is configured as a gate dielectric in a transistor.

9. The electronic device of claim 1, wherein the device is a memory.

10. The electronic device of claim 1, wherein the atomic layer deposited hafnium oxide layer is an amorphous atomic layer deposited hafnium oxide layer.

11. The electronic device of claim 1, wherein the electron beam evaporated lanthanide oxide layer is an amorphous electron beam evaporated lanthanide oxide layer.

12. An electronic device comprising:
a substrate;
a dielectric layer disposed on the substrate, the dielectric layer including:
a hafnium oxide layer arranged as one or more monolayers of hafnium oxide; and
a lanthanide oxide layer, the lanthanide oxide layer having oxygen in addition to oxygen of the lanthanide oxide.

13. The electronic device of claim 12, wherein the dielectric layer includes a nanolaminate.

14. The electronic device of claim 12, wherein the dielectric layer includes multiple lanthanide oxide layers, wherein the combined thickness of the lanthanide oxide layers is between 2 nanometers and 10 nanometers.

15. The electronic device of claim 12, wherein the lanthanide oxide layer includes praseodymium oxide.

16. The electronic device of claim 12, wherein the lanthanide oxide layer includes neodymium oxide.

17. The electronic device of claim 12, wherein the lanthanide oxide layer includes samarium oxide.

18. The electronic device of claim 12, wherein the lanthanide oxide layer includes gadolinium oxide.

19. The electronic device of claim 12, wherein the lanthanide oxide layer includes dysprosium oxide.

20. The electronic device of claim 12, wherein the electronic device includes an information handling device.

21. The electronic device of claim 12, wherein the electronic device includes a system controller.

22. An electronic device comprising:
a substrate;
a dielectric layer disposed on the substrate, the dielectric layer including:

a hafnium oxide layer arranged as one or more monolayers of hafnium oxide;

a first lanthanide oxide layer, the first lanthanide oxide layer having oxygen in addition to oxygen of the lanthanide oxide; and a second lanthanide oxide layer, the second lanthanide oxide layer having a composition different from a composition of the first lanthanide oxide layer.

23. The electronic device of claim 22, wherein the dielectric layer includes a nanolaminate.

24. The electronic device of claim 22, wherein the substrate includes a germanium substrate.

25. The electronic device of claim 22, wherein the substrate includes a gallium arsenide substrate.

26. The electronic device of claim 22, wherein the dielectric layer includes:

a layer of amorphous praseodymium oxide as a first layer on the substrate; and a layer of crystalline praseodymium oxide disposed on and contacting the layer of amorphous praseodymium oxide with the hafnium oxide layer disposed on and contacting the layer of crystalline praseodymium oxide.

27. The electronic device of claim 22, wherein the electronic device includes a memory.

28. The electronic device of claim 22, wherein the electronic device includes a memory controller.

* * * * *